(12) United States Patent
Kanda et al.

(10) Patent No.: US 10,460,805 B2
(45) Date of Patent: Oct. 29, 2019

(54) SEMICONDUCTOR CIRCUIT, METHOD OF DRIVING SEMICONDUCTOR CIRCUIT, AND ELECTRONIC APPARATUS

(71) Applicant: SONY CORPORATION, Tokyo (JP)

(72) Inventors: Yasuo Kanda, Kanagawa (JP); Yuji Torige, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/078,310

(22) PCT Filed: Jan. 27, 2017

(86) PCT No.: PCT/JP2017/002912
§ 371 (c)(1),
(2) Date: Aug. 21, 2018

(87) PCT Pub. No.: WO2017/150028
PCT Pub. Date: Sep. 8, 2017

(65) Prior Publication Data
US 2019/0051354 A1    Feb. 14, 2019

(30) Foreign Application Priority Data
Feb. 29, 2016  (JP) .............................. 2016-037657

(51) Int. Cl.
*G11C 11/00*    (2006.01)
*G11C 14/00*    (2006.01)
(Continued)

(52) U.S. Cl.
CPC .......... *G11C 14/0081* (2013.01); *G11C 11/15* (2013.01); *G11C 11/41* (2013.01);
(Continued)

(58) Field of Classification Search
CPC ... G11C 14/0081; G11C 11/16; G11C 11/161; G11C 11/1677; G11C 11/412;
(Continued)

(56) References Cited

U.S. PATENT DOCUMENTS

2012/0182064 A1*   7/2012  Hiramoto .............. G11C 11/413
                                                              327/540
2013/0028012 A1    1/2013  Fujita et al.
2015/0070975 A1    3/2015  Yamamoto et al.

FOREIGN PATENT DOCUMENTS

JP      2013-030249      2/2013
WO   WO 2009/028298      3/2009
WO   WO 2013/172065     11/2013

OTHER PUBLICATIONS

International Search Report prepared by the Japan Patent Office dated Apr. 6, 2017, for International Application No. PCT/JP2017/002912.

* cited by examiner

*Primary Examiner* — Thong Q Le
(74) *Attorney, Agent, or Firm* — Sheridan Ross P.C.

(57) ABSTRACT

A semiconductor circuit in the disclosure includes a first circuit that is able to generate, on the basis of a voltage in a first node, an inverted voltage of the voltage and to apply the inverted voltage to a second node; a second circuit that is able to generate, on the basis of a voltage in the second node, an inverted voltage of the voltage and to apply the inverted voltage to the first node; a first transistor that couples the first node to a third node; a second transistor that supplies a first direct-current voltage to the third node; a third transistor including a drain or a source to be coupled to the third node and including a gate coupled to the first node or the second node; and a first storage element that is coupled to the third node, and is able to take a first resistance (Continued)

state or a second resistance state. The first circuit and the second circuit are configured to cause the voltage in the first node to easily become a predetermined initial voltage after application of power.

24 Claims, 25 Drawing Sheets

(51) Int. Cl.
*G11C 11/15* (2006.01)
*G11C 11/41* (2006.01)
*G11C 11/412* (2006.01)
*H01L 27/105* (2006.01)
*H01L 27/11* (2006.01)

(52) U.S. Cl.
CPC .......... *G11C 11/412* (2013.01); *H01L 27/105* (2013.01); *H01L 27/11* (2013.01)

(58) Field of Classification Search
CPC . G11C 11/413; G11C 13/0004; G11C 13/004; G11C 13/0069; G11C 2013/0052; G11C 2013/0054
USPC ..... 365/189.09, 207, 158, 189.15, 148, 163, 365/185.08, 189.07, 189.11, 189.14, 190, 365/196, 205, 208, 226
See application file for complete search history.

SEMICONDUCTOR CIRCUIT, METHOD OF DRIVING SEMICONDUCTOR CIRCUIT, AND ELECTRONIC APPARATUS

CROSS REFERENCE TO RELATED APPLICATION

This application is a national stage application under 35 U.S.C. 371 and claims the benefit of PCT Application No. PCT/JP2017/002912 having an international filing date of 27 Jan. 2017, which designated the United States, which PCT application claimed the benefit of Japanese Patent Application No. 2016-037657 filed 29 Feb. 2016, the entire disclosures of each of which are incorporated herein by reference.

TECHNICAL FIELD

The disclosure relates to a semiconductor circuit, a method of driving the semiconductor circuit, and an electronic apparatus including the semiconductor circuit.

BACKGROUND ART

Electronic apparatuses are desired to be low in power consumption in terms of ecology. In semiconductor circuits, for example, there is often used a technology called power gating in which power supply to part of a circuit is selectively stopped, thereby power consumption is reduced. It is desirable for the circuit to which the power supply has been stopped to return to an operation state before the stop of the power supply immediately after a restart of the power supply. Methods to achieve such a restoration operation in such a short time include a method of having a non-volatile memory built in a circuit. For example, PTLs 1 and 2 each disclose a circuit in which SRAM (static random access memory), which is a non-volatile memory, is combined with a spin transfer torque storage element.

CITATION LIST

Patent Literature

PTL 1: International Publication No. WO 2009/028298
PTL 2: Japanese Unexamined Patent Application Publication No. 2013-30249

SUMMARY OF THE INVENTION

Incidentally, a memory circuit is desired to be less likely to have disturbance. Furthermore, a semiconductor circuit is generally desired to be small in circuit area.

It is desirable to provide a semiconductor circuit, a driving method, and an electronic apparatus that make it possible to cause less disturbance and reduce a circuit area.

A semiconductor circuit in an embodiment of the disclosure includes a first circuit, a second circuit, a first transistor, a second transistor, a third transistor, and a first storage element. The first circuit is able to generate, on the basis of a voltage in a first node, an inverted voltage of the voltage and to apply the inverted voltage to a second node. The second circuit is able to generate, on the basis of a voltage in the second node, an inverted voltage of the voltage and to apply the inverted voltage to the first node. The first transistor couples the first node to a third node when being in on state. The second transistor supplies a first direct-current voltage to the third node when being in on state. The third transistor includes a drain or a source to be coupled to the third node and includes a gate coupled to the first node or the second node. The first storage element includes a first terminal coupled to the third node and is able to take a first resistance state or a second resistance state. The above-described first circuit and the second circuit are configured to cause the voltage in the first node to easily become a predetermined initial voltage after application of power.

A driving method in an embodiment of the disclosure includes: preparing a semiconductor circuit, the semiconductor circuit including a first circuit that is able to generate, on a basis of a voltage in a first node, an inverted voltage of the voltage and to apply the inverted voltage to a second node, a second circuit that is able to generate, on a basis of a voltage in the second node, an inverted voltage of the voltage and to apply the inverted voltage to the first node, a first transistor that couples the first node to a third node when being in on state, a second transistor that supplies a first direct-current voltage to the third node when being in on state, a third transistor that includes a drain or a source to be coupled to the third node and includes a gate coupled to the first node or the second node, and a first storage element that includes a first terminal coupled to the third node and a second terminal supplied with a control voltage, and is able to take a first resistance state or a second resistance state, the first circuit and the second circuit being configured to cause the voltage in the first node to easily become a predetermined initial voltage after application of power; performing first driving of, in a first period, setting the control voltage to a first voltage level that is different from a voltage level of the first direct-current voltage, and putting the second transistor into on state and putting the first transistor into off state, thereby putting a resistance state of the first storage element into the first resistance state; and performing second driving of, in a second period that is after the first period, setting the control voltage to a second voltage level, and putting the first transistor and the second transistor into off state, thereby putting the resistance state of the first storage element into a resistance state in accordance with the voltage in the first node.

An electronic apparatus in an embodiment of the disclosure includes the above-described semiconductor circuit and a battery that supplies a power voltage to the semiconductor circuit. The electronic apparatus in an embodiment of the disclosure corresponds to a smartphone, a digital camera, a notebook-sized personal computer, a handheld game console, a video camera, etc.

In the semiconductor circuit, the driving method, and the electronic apparatus in the embodiments of the disclosure, because of the first circuit and the second circuit, voltages inverted to each other appear in the first node and the second node. When the second transistor is in on state, a first direct-current voltage is supplied to the first storage element. Then, a resistance state of the first storage element is set by the third transistor on the basis of the voltage in the first node or the voltage in the second node. When the supply of power has been interrupted, and then power is applied, the voltage in the first node tends to become the predetermined initial voltage by the first circuit and the second circuit. Then, the first transistor is put into on state, thereby the first storage element is coupled to the first node. Accordingly, the voltage in the first node is set in accordance with the resistance state of the first storage element.

According to the semiconductor circuit, the driving method, and the electronic apparatus in the embodiments of the disclosure, the third transistor and the first storage element are provided, and the first circuit and the second circuit are configured to cause the voltage in the first node to easily become the predetermined initial voltage after application of power; therefore, it is possible to cause less disturbance and also possible to reduce the circuit area. It is to be noted that the effects described here are not necessarily limited, and may include any effect described in the disclosure.

MODES FOR CARRYING OUT THE INVENTION

In the following, some embodiments of the disclosure are described in detail with reference to drawings. It is to be noted that description is made in the following order:
1. Embodiment
2. Application Example and Practical Application Example.
<1. Embodiment>
[Configuration Example]

Figure 1:
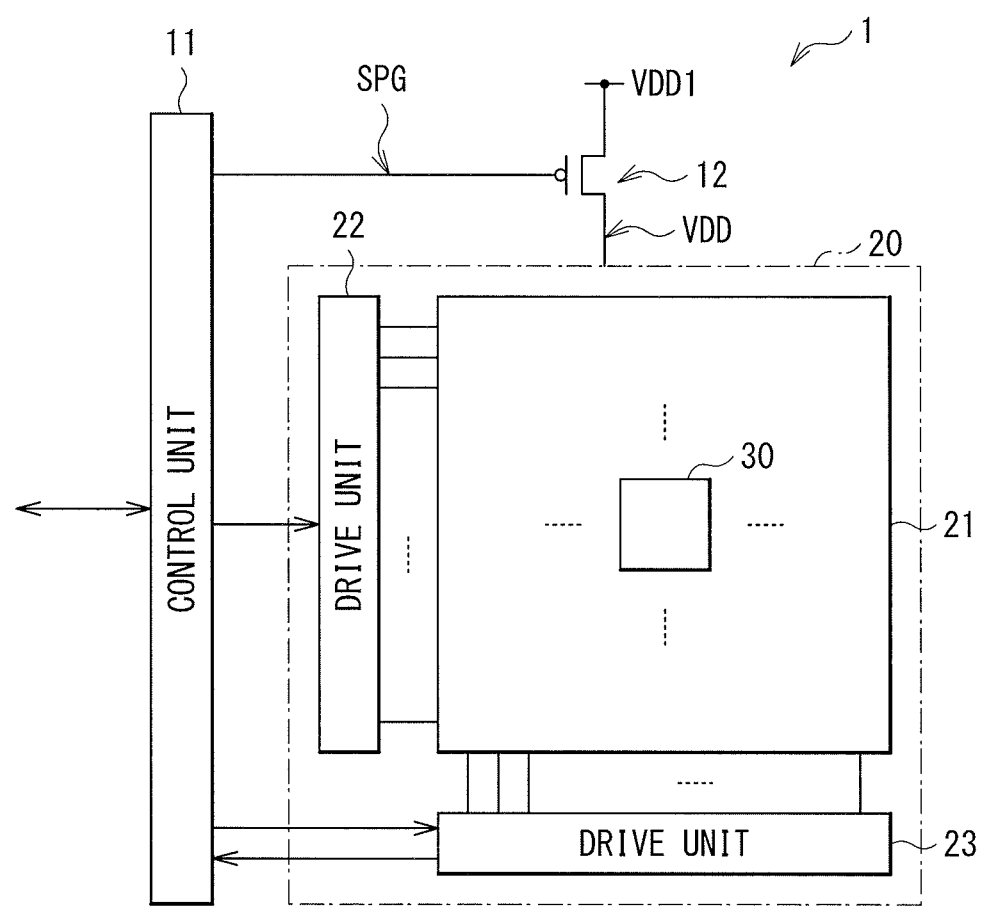
FIG. 1 is a block diagram representing a configuration example of a semiconductor circuit according to an embodiment of the disclosure.

FIG. 1 represents a configuration example of a semiconductor circuit 1 according to an embodiment. The semiconductor circuit 1 is a circuit that stores therein information. It is to be noted that a semiconductor circuit driving method according to an embodiment of the disclosure is embodied by the present embodiment, and therefore is also described at the same time. The semiconductor circuit 1 includes a control unit 11, a power transistor 12, and a memory circuit 20.

The control unit 11 controls operation of the memory circuit 20. Specifically, the control unit 11 writes information in the memory circuit 20 on the basis of a write command and write datathat are supplied from the outside, and reads information from the memory circuit 20 on the basis of a read command supplied from the outside. Furthermore, the control unit 11 also has a function of controlling power supply to the memory circuit 20 by supplying a power control signal SPG to the power transistor 12 thereby turning the power transistor 12 on/off.

In this example, the power transistor 12 is a P-type MOS (metal oxide semiconductor) transistor; a gate of the power transistor 12 is supplied with a power control signal SPG, and a source thereof is supplied with a power voltage VDD1, and a drain thereof is coupled to the memory circuit 20.

By this configuration in the semiconductor circuit 1, in a case of using the memory circuit 20, the power transistor 12 is put into on state, and a power voltage VDD1 as a power voltage VDD is supplied to the memory circuit 20. Furthermore, in the semiconductor circuit 1, in a case of not using the memory circuit 20, the power transistor 12 is put into off state. This so-called power gating enables the semiconductor circuit 1 to reduce power consumption.

The memory circuit 20 stores therein data. The memory circuit 20 has a memory cell array 21 and drive units 22 and 23.

The memory cell array 21 includes memory cells 30 disposed in a matrix.

Figure 2:
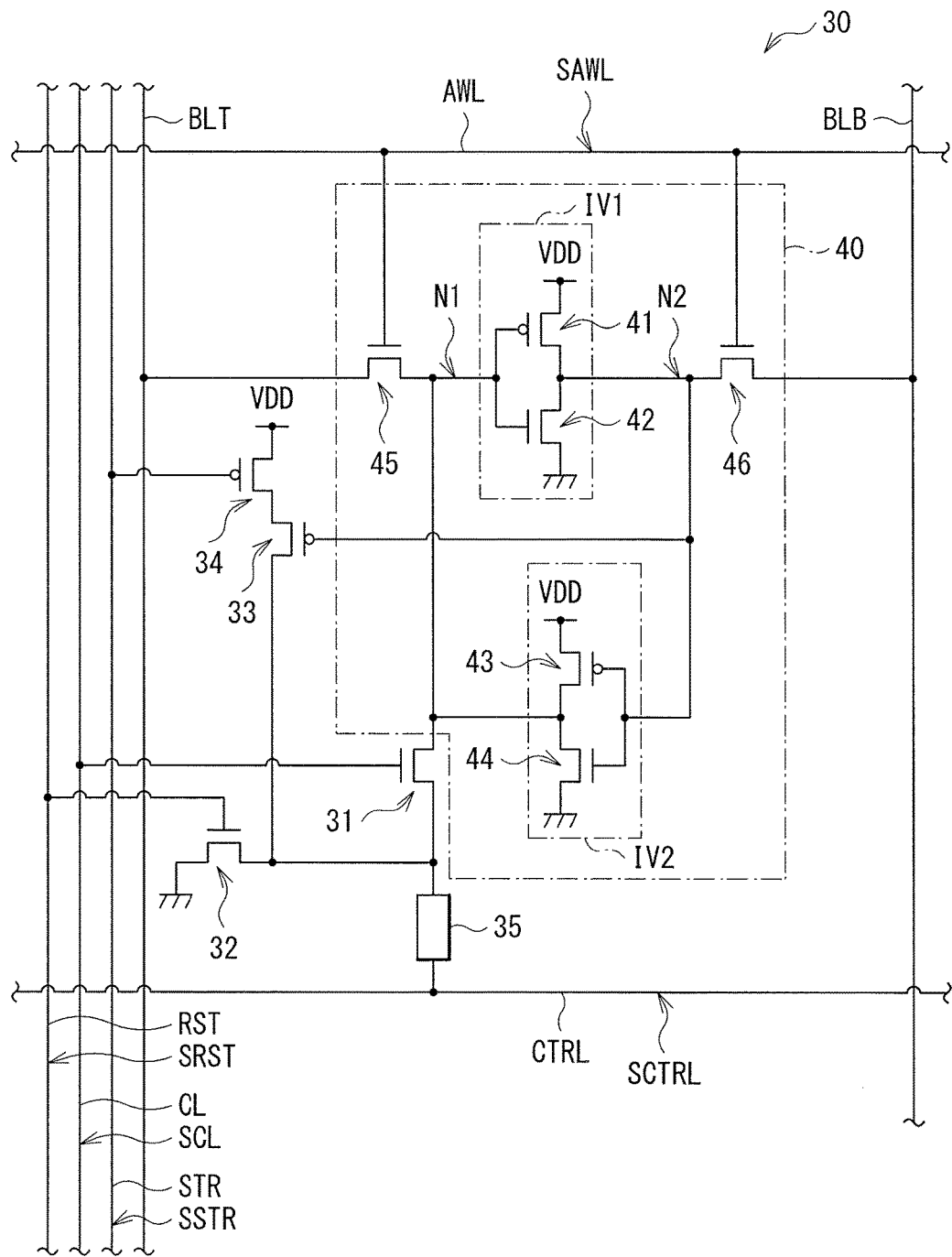
FIG. 2 is a circuit diagram representing a configuration example of a memory cell illustrated in FIG. 1.
Figure 3:
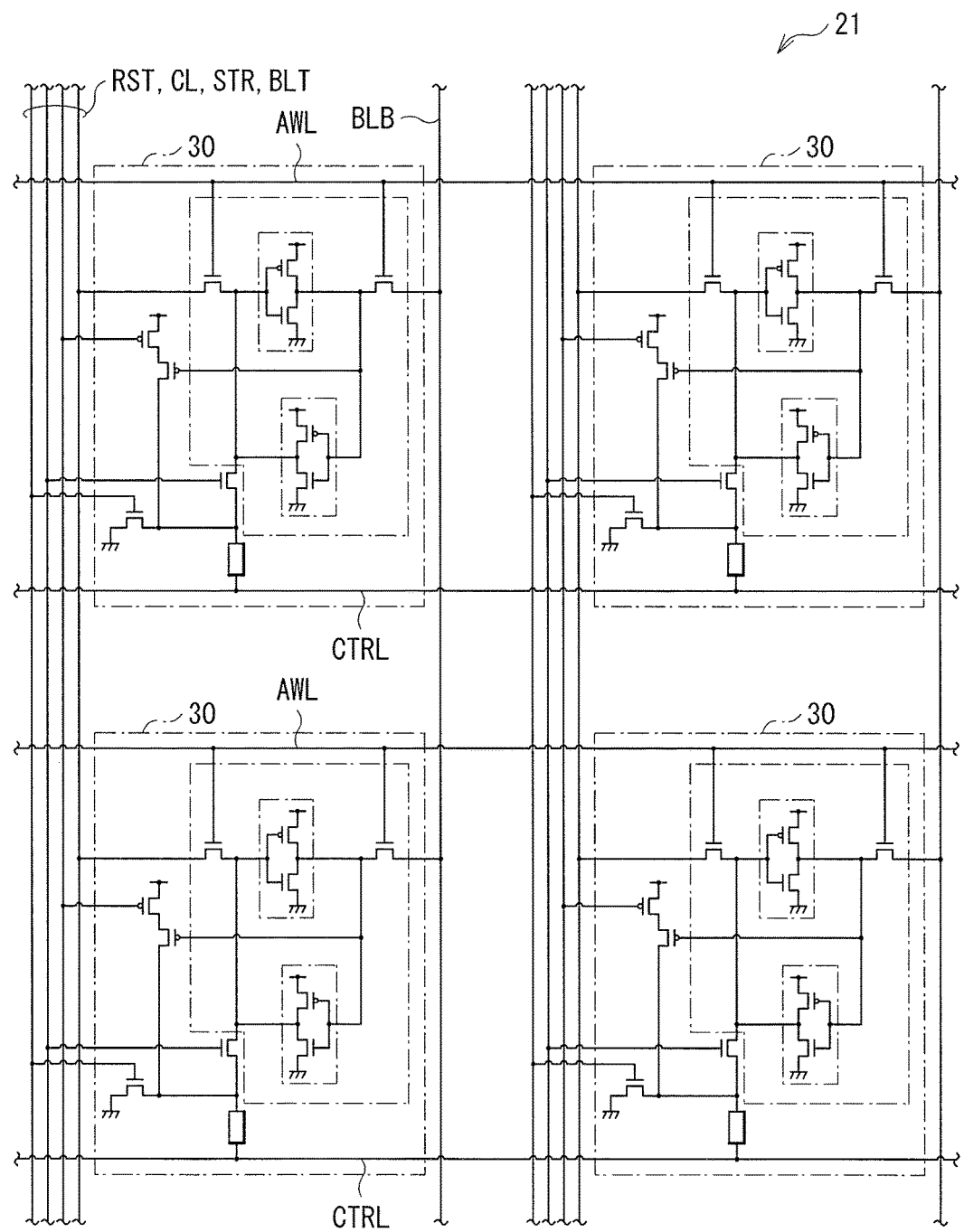
FIG. 3 is a circuit diagram representing a configuration example of a memory cell array illustrated in FIG. 1.

FIG. 2 represents a configuration example of the memory cell 30. FIG. 3 represents a configuration example of the memory cell array 21. The memory cell array 21 has multiple word lines AWL, multiple control lines CTRL, multiple bit lines BLT, multiple bit lines BLB, multiple control lines RST, multiple control lines CL, and multiple control lines STR. The word lines AWL extend in a lateral direction in FIGS. 2 and 3, and one ends thereof are coupled to the drive unit 22; a signal SAWL is applied to the word lines AWL by the drive unit 22. The control lines CTRL extend in the lateral direction in FIGS. 2 and 3, and one ends thereof are coupled to the drive unit 22; a signal SCTRL is applied to the control lines CTRL by the drive unit 22. The hit lines BLT extend in a longitudinal direction in FIGS. 2 and 3, and one ends thereof are coupled to the drive unit 23. The hit lines BLB extend in the longitudinal direction in FIGS. 2 and 3, and one ends thereof are coupled to the drive unit 23. The control lines RST extend in the longitudinal direction in FIGS. 2 and 3, and one ends thereof are coupled to the drive unit 23; a signal SRST is applied to the control lines RST by the drive unit 23. The control lines CL extend in the longitudinal direction in FIGS. 2 and 3, and one ends thereof are coupled to the drive unit 23; a signal SCL is applied to the control lines CL by the drive unit 23. The control lines SIR extend in the longitudinal direction in FIGS. 2 and 3, and one ends thereof are coupled to the drive unit 23; a signal SSTR is applied to the control lines SIR by the drive unit 23.

The memory cell 30 has an SRAM (Static Random Access Memory) circuit 40, transistors 31 to 34, and a storage element 35.

The SRAM circuit 40 stores therein 1-bit information through positive feedback. The SRAM 40 has transistors 41 to 46. The transistors 41 and 43 are P-type MOS transistors, and the transistors 42, 44, 45, and 46 are N-type MOS transistors.

A gate of the transistor 41 is coupled to a node N1, a source thereof is supplied with a power voltage VDD, and a drain thereof is coupled to a node N2. In this example, a gate length L of the transistor 41 is equal to that of the transistor 43, and a gate width W of the transistor 41 is smaller than that of the transistor 43. A gate of the transistor 42 is coupled to the node N1, a source thereof is grounded, and a drain thereof is coupled to the node N2. In this example, a gate length L of the transistor 42 is equal to that of the transistor 44, and a gate width W of the transistor 42 is larger than that of the transistor 44. The transistors 41 and 42 configure an inverter IV1. The inverter IV1 inverts a voltage VN1 in the node N1, and outputs a result of the inversion to the node N2.

A gate of the transistor 43 is coupled to the node N2, a source thereof is supplied with a power voltage VDD, and a drain thereof is coupled to the node N1. In this example, a gate length L of the transistor 43 is equal to that of the transistor 41, and a gate width W of the transistor 43 is larger than that of the transistor 41. A gate of the transistor 44 is coupled to the node N2, a source thereof is grounded, and a drain thereof is coupled to the node N1. In this example, a gate length L of the transistor 44 is equal to that of the transistor 42, and a gate width W of the transistor 44 is smaller than that of the transistor 42. The transistors 43 and 44 configure an inverter IV2. The inverter IV2 inverts a voltage VN2 in the node N2, and outputs a result of the inversion to the node N1.

A gate of the transistor 45 is coupled to a word line AWL, a source thereof is coupled to a bit line BLT, and a drain thereof is coupled to the node N1. A gate of the transistor 46 is coupled to the word line AWL, a source thereof is coupled to a bit line BLB, and a drain thereof is coupled to the node N2.

By this configuration, an input terminal of the inverter IV1 and an output terminal of the inverter IV2 are coupled to each other, and an input terminal of the inverter IV2 and an output terminal of the inverter IV1 are coupled to each other. Accordingly, the SRAM circuit 40 stores therein 1-bit information through positive feedback. Then, in the SRAM circuit 40, when the transistors 45 and 46 are in on state, information is written or read through the hit lines BLT and BLB.

Furthermore, in the SRAM circuit 40, the gate width W of the transistor 43 in the inverter IV2 is larger than the gate width W of the transistor 41 in the inverter IV1, and the gate width W of the transistor 42 in the inverter IV1 is larger than the gate width W of the transistor 44 in the inverter IV2. Accordingly, immediately after application of power, the inverter IV2 easily outputs a high level, and the inverter IV1 easily outputs a low level. In this way, the SRAM circuit 40 is configured to easily bring the voltage in the node N1 to high level immediately after application of power.

The transistors 31 and 32 are N-type MOS transistors, and the transistors 33 and 34 are P-type MOS transistors. A gate of the transistor 31 is coupled to a control line CL, a drain thereof is coupled to the node N1, and a source thereof is coupled to respective drains of the transistors 32 and 33 and one end of the storage element 35. A gate of the transistor 32 is coupled to a control line RST, the drain thereof is coupled to the source of the transistor 31, the drain of the transistor 33, and one end of the storage element 35, and a source thereof is grounded. A gate of the transistor 33 is coupled to the node N2, a source thereof is coupled to a drain of the transistor 34, and the drain is coupled to the source of the transistor 31, the drain of the transistor 32, and one end of the storage element 35. A gate of the transistor 34 is coupled to a control line STR, a source thereof is supplied with a power voltage VDD, and the drain is coupled to the source of the transistor 33.

The storage element 35 is a non-volatile storage element, and, in this example, is a spin transfer torque (STT; Spin Transfer Torque) magnetic tunnel junction (MTJ; Magnetic Tunnel Junction) device that changes a direction of magnetization in a free layer F (to be described later) by spin injection, thereby storing therein information. One end of the storage element 35 is coupled to the source of the transistor 31 and the drains of the transistors 32 and 33, and the other end is coupled to a control line CTRL.

Figure 4:
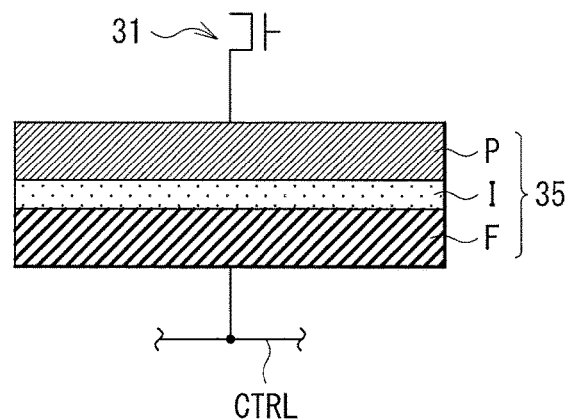
FIG. 4 is an explanatory diagram representing a configuration example of a storage element illustrated in FIG. 2.

FIG. 4 represents a configuration example of the storage element 35. The storage element 35 has a pinned layer P, a tunnel barrier layer I, and the free layer F. In this example, the pinned layer P is coupled to the transistors 31 to 33 disposed on the lower layer side of a chip of the semiconductor circuit 1, it is to be noted that only the transistor 31 is depicted in this FIG. 4. Furthermore, the free layer F is coupled to the control line CTRL disposed on the upper layer side of the chip of the semiconductor circuit 1. That is, the storage element 35 has a so-called bottom pin structure in which the free layer F, the tunnel barrier layer I, and the pinned layer P are stacked in this order from the upper layer side.

The pinned layer P includes a ferromagnetic body whose direction of magnetization PJ is fixed, for example, in a vertical direction of a film surface. The free layer F includes a ferromagnetic body whose direction of magnetization FJ varies, for example, in the vertical direction of the film surface in accordance with an inflowing spin polarized current. The tunnel barrier layer I functions so as to cut magnetic connection between the pinned layer P and the free layer F and let a tunnel current flow.

By this configuration in the storage element 35, for example, in a case where a current flows from the free layer F to the pinned layer P, polarized electrons having the moment (spin) in the same direction as the magnetization PJ of the pinned layer P are injected from the pinned layer P into the free layer F, and the direction of the magnetization FJ of the free layer F becomes the same direction as the direction of the magnetization PJ of the pinned layer P (a parallel state). When the storage element 35 is in such a parallel state, a resistance value between both ends becomes low (a low-resistance state RL).

Furthermore, for example, in a case where a current flows from the pinned layer P to the free layer F, electrons are injected from the free layer F into the pinned layer P. At this time, of the injected electrons, polarized electrons having the moment in the same direction as the magnetization PJ of the pinned layer P go through the pinned layer P, and polarized electrons having the moment in a direction opposite to the magnetization PJ of the pinned layer P are reflected by the pinned layer P and injected into the free layer F. Accordingly, the direction of the magnetization FJ of the free layer F becomes the opposite direction to the direction of the magnetization PJ of the pinned layer P (an antiparallel state). When the storage element 35 is in such an antiparallel state, a resistance value between both ends becomes high (a high-resistance state RH).

In this way, in the storage element 35, the direction of the magnetization FJ of the free layer F varies in accordance with a direction of a current flowing, thereby the resistance state changes between the high-resistance state RH and the low-resistance state RL. Setting the resistance state in this way allows the storage element 35 to store therein information.

In this way, the memory cell 30 is provided with the transistors 31 to 34 and the storage element 35 in addition to the SRAM circuit 40. Accordingly, for example, in a case where a standby operation is performed by putting the power transistor 12 into off state, performing a store operation immediately before the power transistor 12 is put into off state makes it possible to cause information stored in the SRAM circuit 40, which is a volatile memory, to be stored in the storage element 35, which is a non-volatile memory. Then, in a case where a normal operation is performed after the standby operation is performed, the semiconductor circuit 1 performs a restore operation just after the power transistor 12 is put into on state, which makes it possible to cause the information stored in the storage element 35 to be stored in the SRAM circuit 40. Accordingly, in the semiconductor circuit 1, it is possible to restore the state of each memory 30 to a state before the power supply is stopped, in a short time after power supply is resumed.

The drive unit 22 applies, on the basis of a control signal supplied from the control unit 11, a signal SAWL to a word line AWL and a signal SCTRL to a control line CTRL.

The drive unit 23 applies, on the basis of a control signal supplied from the control unit 11, a signal SRST to a control line RST, a signal SCL to a control line CL, and a signal SSTR to a control line STR. Furthermore, on the basis of a control signal and data that are supplied from the control unit 11, the drive unit 23 writes information in the memory cell array 21 through bit lines BLT and BLB. Moreover, on the basis of a control signal supplied from the control unit 11, the drive unit 23 reads information from the memory cell array 21 through bit lines BLT and BLB, and supplies the read information to the control unit 11.

Here, the inverter IV1 corresponds to a specific example of a "first circuit" in the disclosure, and the inverter IV2 corresponds to a specific example of a "second circuit" in the disclosure. The transistor 31 corresponds to a specific example of a "first transistor" in the disclosure, the transistor 32 corresponds to a specific example of a "second transistor" in the disclosure, the transistor 33 corresponds to a specific example of a "third transistor" in the disclosure, and the transistor 34 corresponds to a specific example of a "fourth transistor" in the disclosure. The storage element 35 corresponds to a specific example of a "first storage element" in the disclosure. The transistor 41 corresponds to a specific example of an "eighth transistor" in the disclosure, the transistor 43 corresponds to a specific example of a "ninth transistor" in the disclosure, the transistor 44 corresponds to a specific example of a "tenth transistor" in the disclosure, and the transistor 42 corresponds to a specific example of an "eleventh transistor" in the disclosure.

[Operation and Working]

Subsequently, operation and working of the semiconductor circuit 1 in the present embodiment are described.

(Overview of Overall Operation)

First, an overview of overall operation of the semiconductor circuit 1 is described with reference to FIG. 1. The control unit 11 controls operation of the memory circuit 20. Specifically, the control unit 11 writes information in the memory circuit 20 on the basis of a write command and write data that are supplied from the outside, or reads information from the memory circuit 20 on the basis of a read command supplied from the outside. Furthermore, the control unit 11 controls power supply to the memory circuit 20 by supplying a power control signal SPG to the power transistor 12 thereby turning the power transistor 12 on/off. The power transistor 12 performs an on/oft operation on the basis of a control signal supplied from the control unit 11. Then, when the power transistor 12 is in on state, a power voltage VDD1 is supplied as a power voltage VDD to the memory circuit 20. On the basis of a control signal supplied from the control unit 11, the drive unit 22 of the memory circuit 20 applies a signal SAWL to a word line AWL, and applies a signal SCTRL to a control line CTRL. On the basis of a control signal supplied from the control 11, the drive unit 23 applies a signal SRST to a control line RST, a signal SCL to a control line CL, and a signal SSTR to a control line STR. Furthermore, on the basis of a control signal and data that are supplied from the control unit 11, the drive unit 23 writes information in the memory cell array 21 through bit lines BLT and BLB. Moreover, on the basis of a control signal supplied from the control unit 11, the drive unit 23 reads information from the memory cell array 21 through bit lines BLT and BLB, and supplies the read information to the control unit 11.

(Detailed Operation)

In a normal operation M1, the semiconductor circuit 1 causes information to be stored in the SRAM circuit 40, which is a volatile memory. Furthermore, by performing a reset operation M2, the semiconductor circuit 1 resets the resistance state of the storage element 35 to a predetermined state (in this example, the low-resistance state RL). Then, for example, in a case where a standby operation M4 is performed by putting the power transistor 12 into off state, the semiconductor circuit 1 performs a store operation M3 immediately before the power transistor 12 is put into off state, thereby causing the information stored in the SRAM circuit 40, which is a volatile memory, to be stored in the storage element 35, which is a non-volatile memory. Then, in a case where the normal operation M1 is performed after the standby operation M4, the semiconductor circuit 1 performs a restore operation M5 immediately after the power transistor 12 is put into on state, thereby causing the information stored in the storage element 35 to be stored in the SRAM circuit 40. This operation is described in detail below.

Figure 5:
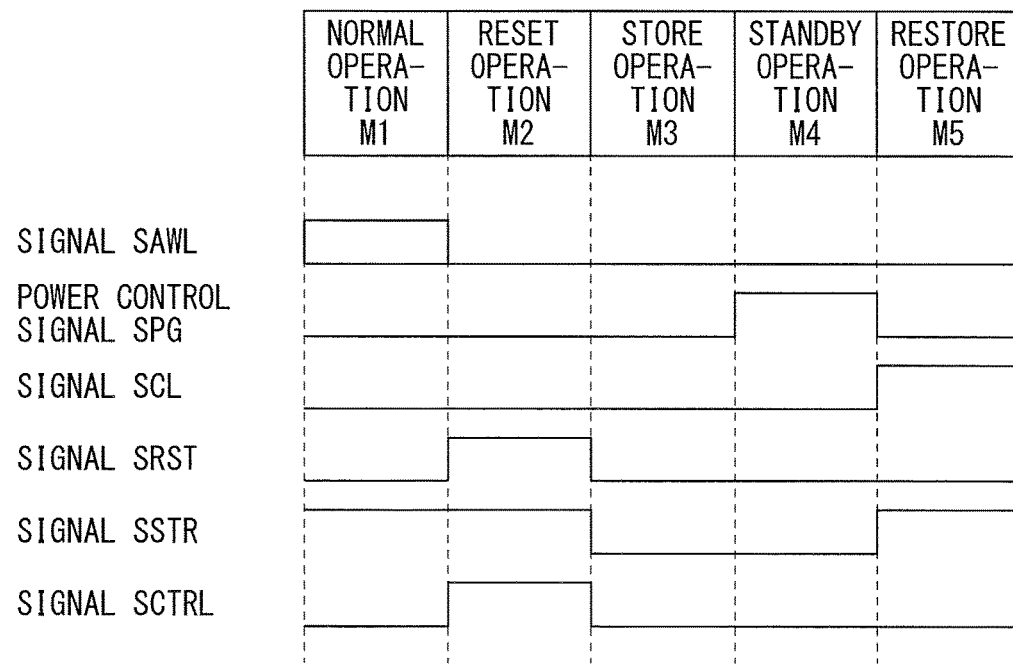
FIG. 5 is an explanatory diagram representing an example of an operation of the memory cell illustrated in FIG. 2.
Figure 6A:
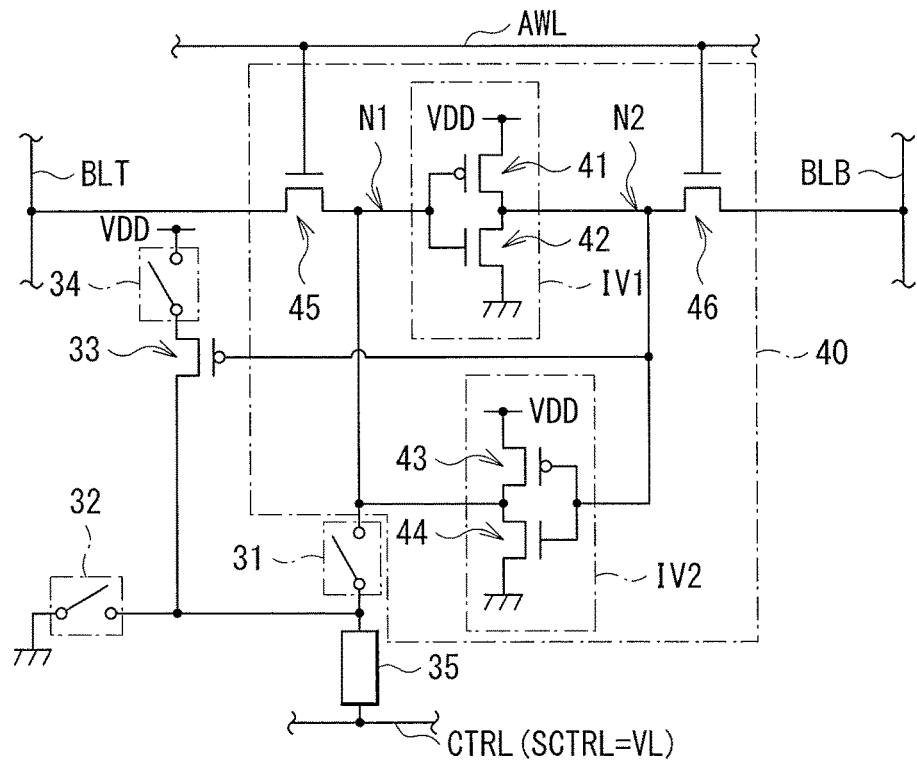
FIG. 6A is a circuit diagram representing an example of an operation of the memory cell illustrated in FIG. 2.
Figure 6B:
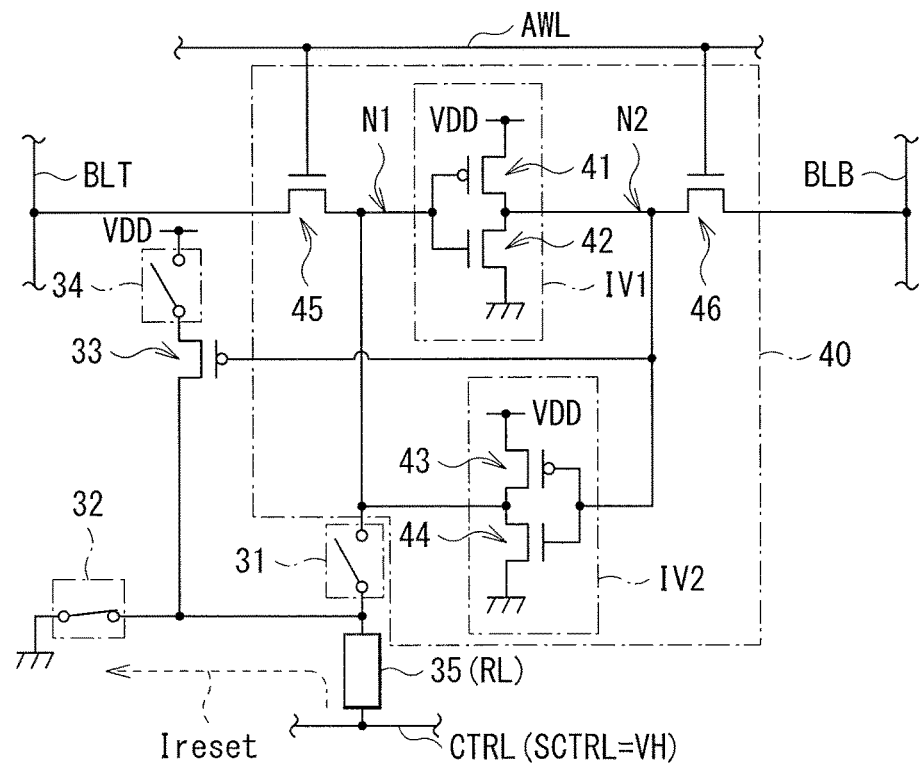
FIG. 6B is another circuit diagram representing an example of an operation of the memory cell illustrated in FIG. 2.
Figure 7A:
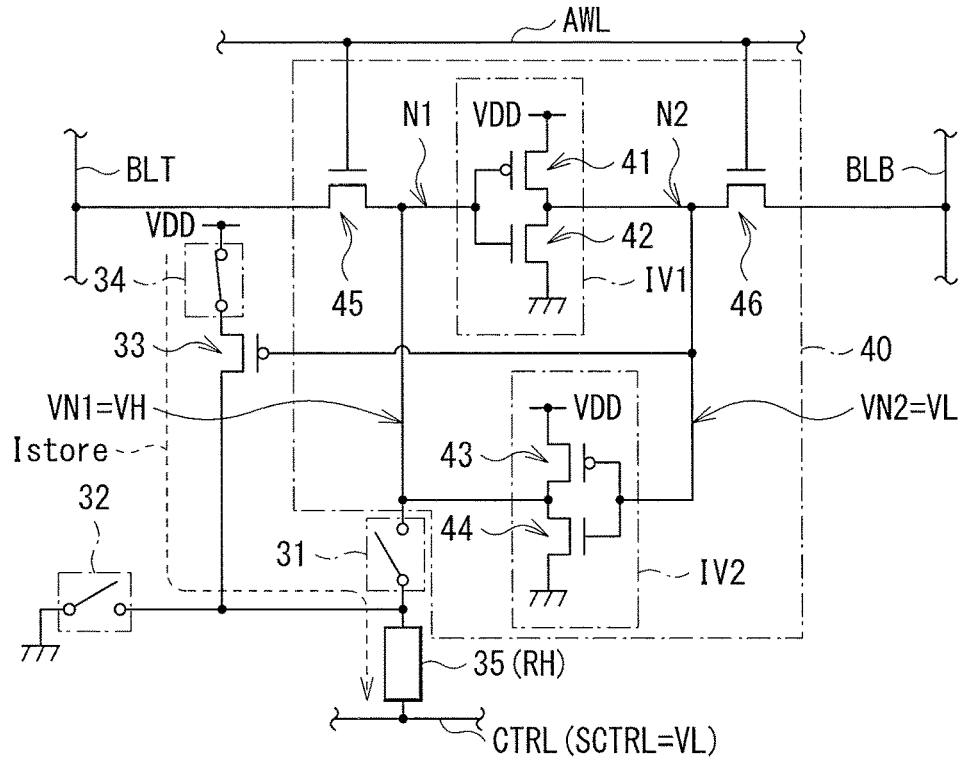
FIG. 7A is another circuit diagram representing an example of an operation of the memory cell illustrated in FIG. 2.
Figure 7B:
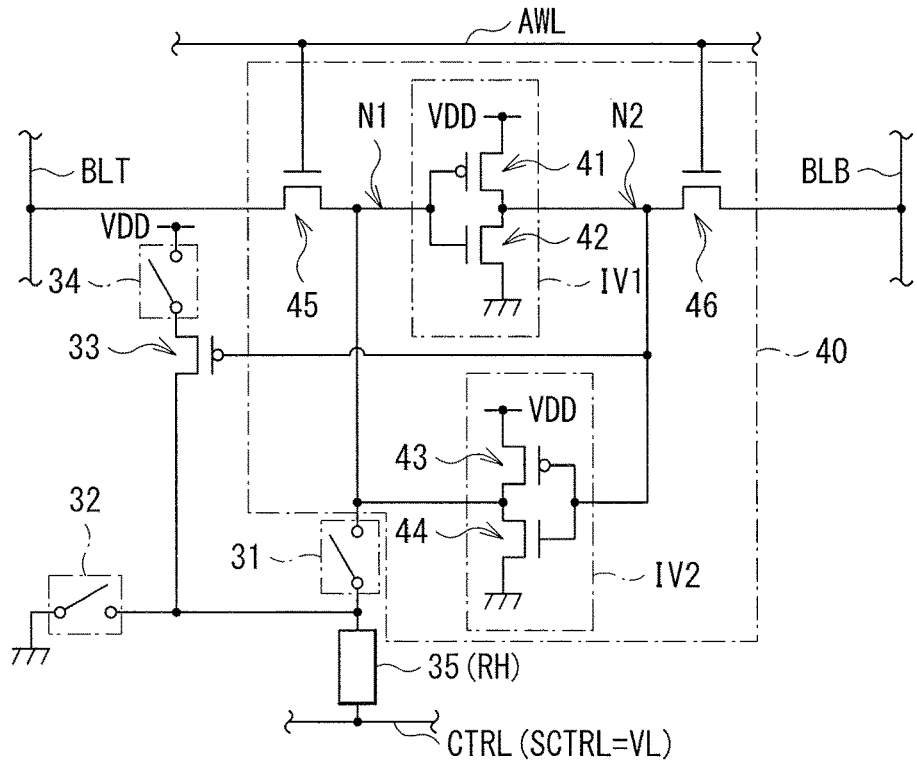
FIG. 7B is another circuit diagram representing an example of an operation of the memory cell illustrated in FIG. 2.
Figure 7C:
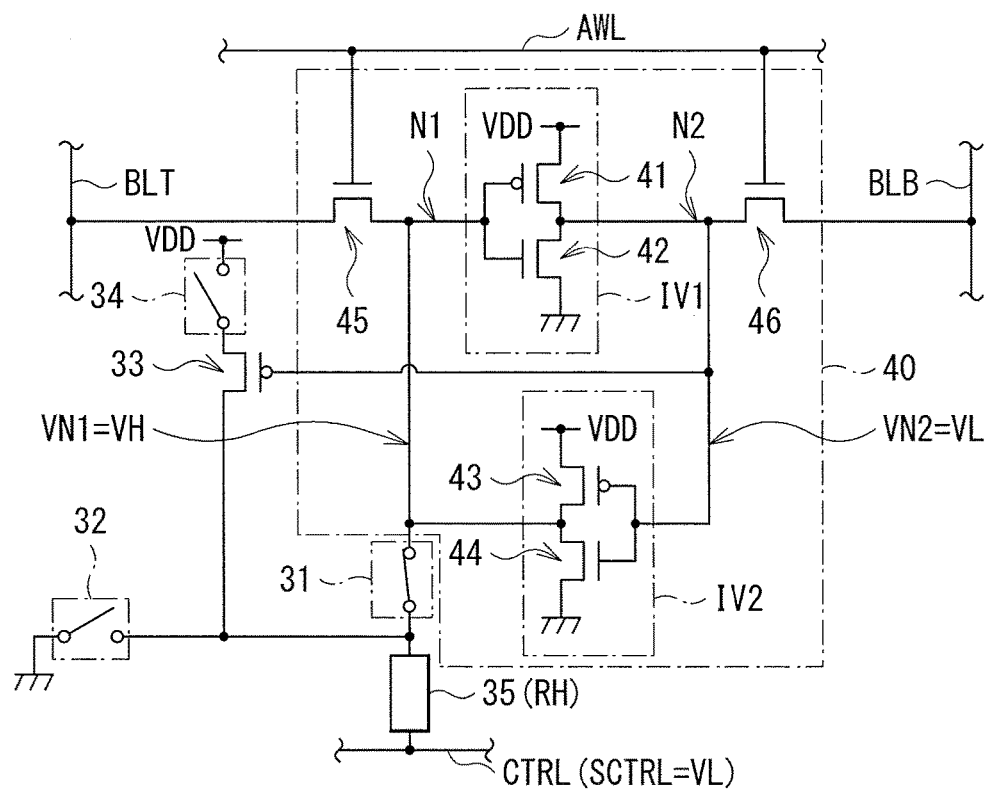
FIG. 7C is another circuit diagram representing an example of an operation of the memory cell illustrated in FIG. 2.
Figure 8A:
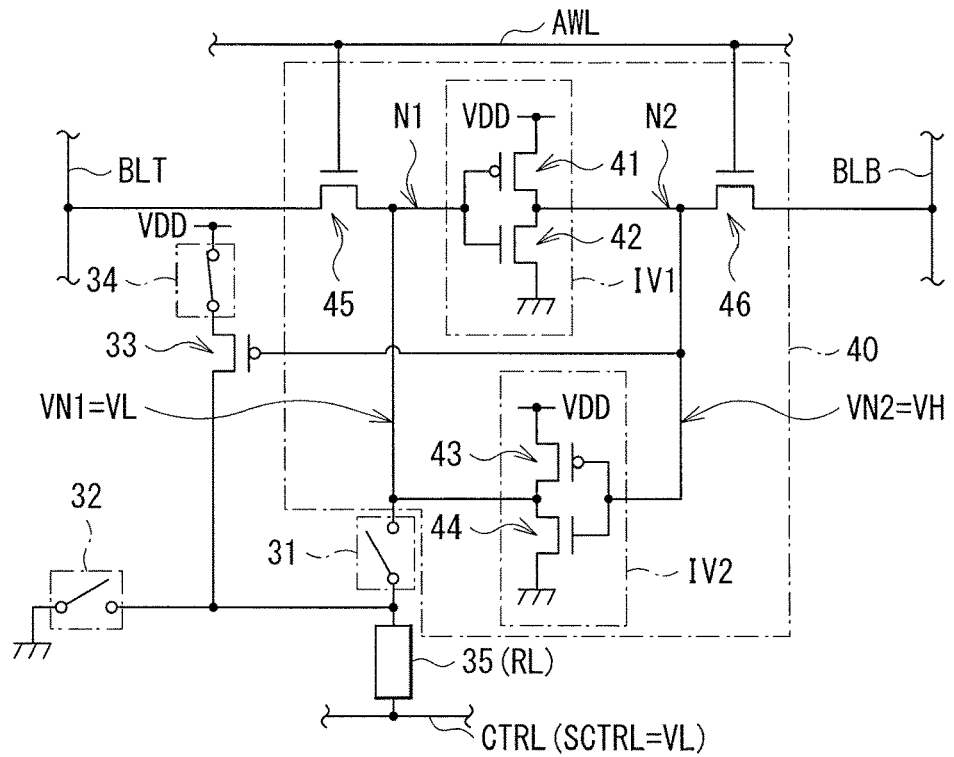
FIG. 8A is another circuit diagram representing an example of an operation of the memory cell illustrated in FIG. 2.
Figure 8B:
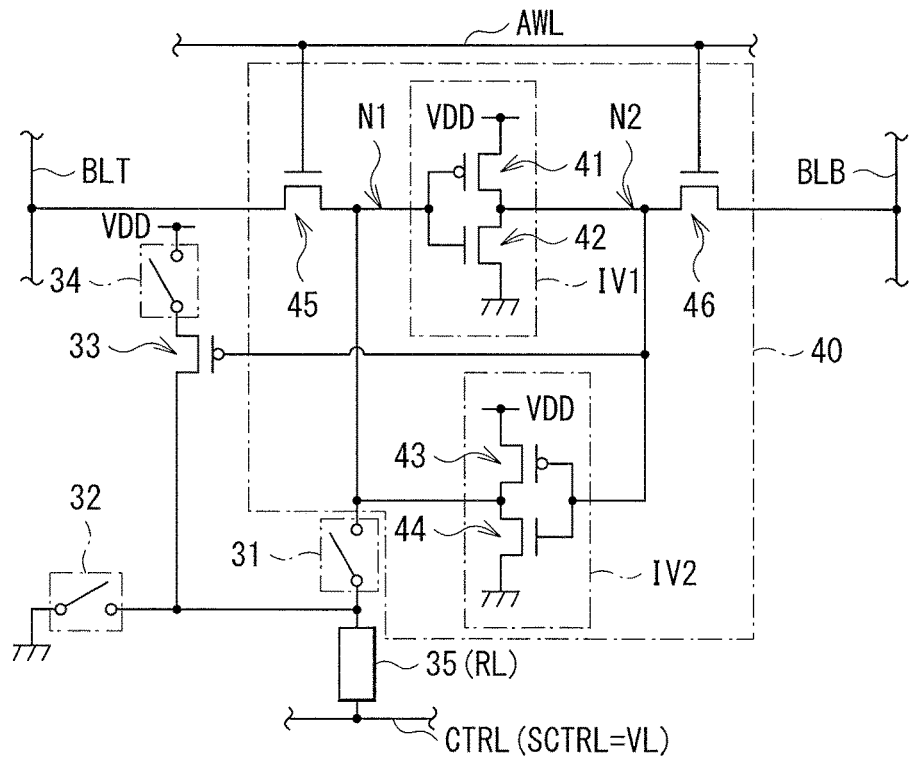
FIG. 8B is another circuit diagram representing an example of an operation of the memory cell illustrated in FIG. 2.
Figure 8C:
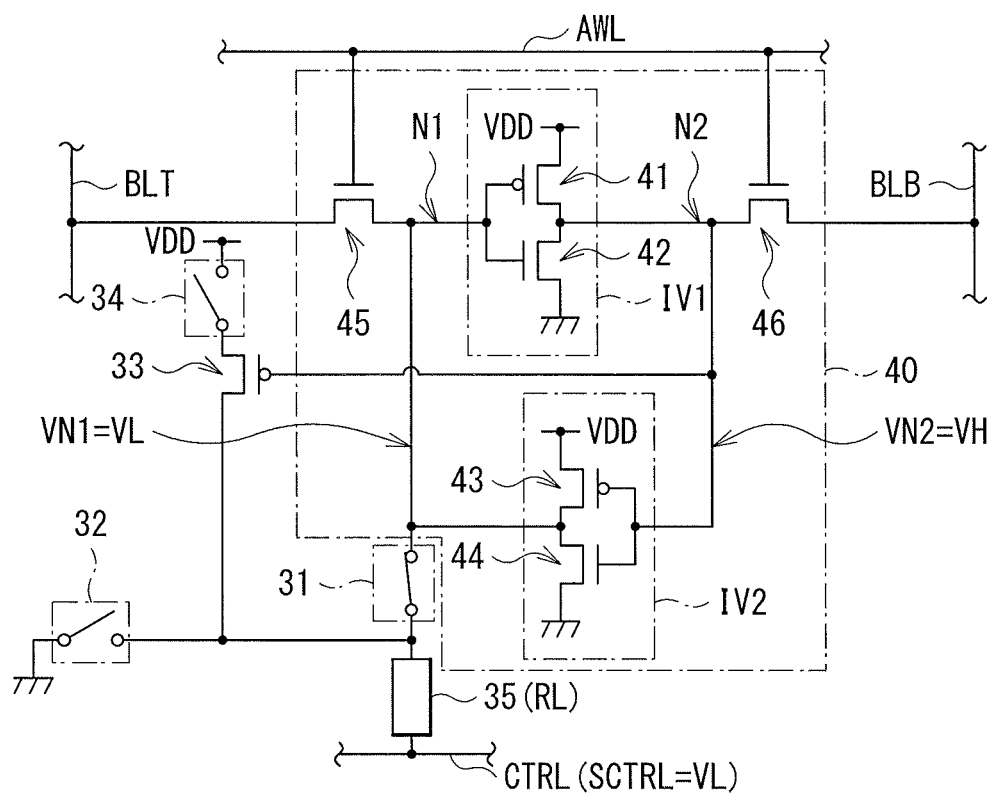
FIG. 8C is another circuit diagram representing an example of an operation of the memory cell illustrated in FIG. 2.

FIG. 5 represents an operation example of a memory cell 30 of interest, in the semiconductor circuit 1. FIGS. 6A, 6B, 7A to 7C, and 8A to 8C represent a state of the memory cell 30. FIG. 6A illustrates a state in the normal operation M1, and FIG. 6B illustrates a state in the reset operation M2. FIGS. 7A to 7C illustrate a state in a case where the voltage VN1 in the node N1 is a high level VH (VN1=VH); FIG. 7A illustrates a state in the store operation M3, FIG. 7B illustrates a state in the standby operation M4, and FIG. 7C illustrates a state in the restore operation M5. FIGS. 8A to 8C illustrate a state in a case where the voltage VN1 in the node N1 is a low level VL (VN1=VL); FIG. 8A illustrates a state in the store operation M3, FIG. 8B illustrates a state in the standby operation M4, and FIG. 8C illustrates a state in the restore operation M5. In FIGS. 6A, 6B, 7A to 7C, and 8A to 8C, the transistors 31, 32, and 34 are each illustrated with use of a switch in accordance with an operating state of the transistor.

(Normal Operation M1)

In the normal operation M1, as illustrated in FIG. 5, the control unit 11 sets a voltage of a power control signal SPG to low level. Accordingly, the power transistor 12 (FIG. 1) is put into on state, and the memory cell 30 is supplied with a power voltage VDD. Furthermore, the drive unit 23 sets respective voltages of signals SCL and SRST to low level, and sets a voltage of a signal SSTR to high level. Accordingly, as illustrated in FIG. 6A, the transistors 31, 32, and 34 are all put into off state. That is, the SRAM circuit 40 is electrically separated from the storage element 35. Moreover, the drive unit 22 sets a voltage of a signal SCTRL to the low level VL (a ground level).

In this normal operation M1, information is written in the SRAM circuit 40 of the memory cell 30, or information is read from the SRAM circuit 40. Specifically, in a case where information is written in the SRAM circuit 40, first, the drive unit 22 sets a voltage of a signal SAWL to high level, thereby the transistors 45 and 46 of the SRAM circuit 40 are put into on state. Then, the drive unit 23 applies respective signals having voltage levels inverted to each other in accordance with the writing information to bit lines BLT and BLB. Furthermore, in a case where information is read from the SRAM circuit 40, the drive unit 23 pre-charges the bit lines BLT and BLB with, for example, a high-level voltage, and after that, the drive unit 22 sets a voltage of a signal SAWL to high level, thereby the transistors 45 and 46 are put into on state. Accordingly, the voltage of either the bit line BLT or the bit line BLB varies in accordance with information stored in the SRAM circuit 40. Then, the drive unit 23 detects a difference in voltage between the bit lines BLT and BLB, thereby reading the information stored in the SRAM circuit 40.

(Reset Operation M2)

The semiconductor circuit 1 performs the reset operation M2 before the store operation M3, thereby resetting the resistance state of the storage element 35 to a predetermined state (in this example, the low-resistance state RL). Specifically, it is possible for the semiconductor circuit 1 to perform the reset operation M2 in parallel with, for example, the normal operation M1.

In this reset operation M2, as illustrated in FIG. 5, the drive unit 23 sets respective voltages of signals SRST and SSTR to high level, and sets a voltage of a signal SCL to low level. Accordingly, as illustrated in FIG. 6B, the transistor 32 is put into on state, and the transistors 31 and 34 are both put into off state. Furthermore, the drive unit 22 sets a voltage of a signal SCTRL to the high level VH. Accordingly, a reset current Ireset flows into a control line CTRL, the storage element 35, and the transistor 32 in this order.

At this time, for example, in the storage element 35, the reset current Ireset flows from the free layer F to the pinned layer P; therefore, a direction of magnetization FJ of the free layer F becomes the same direction as a direction of magnetization PJ of the pinned layer P (a parallel state), and as a result, the resistance state of the storage element 35 becomes the low-resistance state RL. In this way, through the reset operation M2, the resistance state of the storage element 35 is reset and becomes the low-resistance state RL.

(Store Operation M3)

Subsequently, there is described a case where the standby operation M4 is performed by putting the power transistor 12 into off state. In this case, the semiconductor circuit 1 first performs the store operation M3, thereby causing information stored in the SRAM circuit 40 to be stored in the storage element 35.

In the store operation M3, as illustrated in FIG. 5, the drive unit 23 sets respective voltages of signals SCL, SRST, and SSTR to low level. Accordingly, as illustrated in FIGS. 7A and 8A, the transistor 34 is put into on state, and the transistors 31 and 32 are both put into off state. Furthermore, the drive unit 22 sets a voltage of a signal SCTRL to the low level VL (the ground level). Accordingly, the resistance state of the storage element 35 is set in accordance with the information stored in the SRAM circuit 40.

Specifically, for example, in a case where the voltage VN1 in the node N1 is the high level VH (VN1=VH) as illustrated in FIG. 7A, the voltage VN2 in the node N2 becomes the low level VL (VN2=VL). Accordingly, a store current Istore flows into the transistor 34, the transistor 33, and the storage element 35 in this order. At this time, in the storage element 35, the store current Istore flows from the pinned layer P to the free layer F; therefore, a direction of magnetization FJ of the free layer F becomes a direction opposite to a direction of magnetization PJ of the pinned layer P (an antiparallel state), and as a result, the resistance state of the storage element 35 becomes the high-resistance state RH.

Furthermore, for example, in a case where the voltage VN1 in the node N1 is the low level VL (VN1=VL) as illustrated in FIG. 8A, the voltage VN2 in the node N2 becomes the high level VH (VN2=VH). In this case, no current flows into the storage element 35, and therefore the resistance state of the storage element 35 is maintained in the low-resistance state RL.

(Standby Operation M4)

Then, after the store operation M3, the semiconductor circuit 1 performs the standby operation M4 by putting the power transistor 12 into off state.

In the standby operation M4, as illustrated in FIG. 5, the control unit 11 sets a voltage of a power control signal SPG to high level. Accordingly, the power transistor 12 (FIG. 1) is put into off state, and power supply to the memory cell 30 is stopped. Accordingly, respective voltages of signals SCL, SRST, and SSTR become low level. As a result, as illustrated in FIGS. 7B and 8B, the transistors 31, 32, and 34 are all put into off state. Furthermore, a voltage of a signal SCTRL becomes the low level VL. At this time, the resistance state of the storage element 35 is maintained.

(Restore Operation M5)

Subsequently, there is described a case where the normal operation M1 is performed by putting the power transistor 12 into on state. In this case, the semiconductor circuit 1 first puts the power transistor 12 into on state, and then performs the restore operation M5, thereby causing information stored in the storage element 35 to be stored in the SRAM circuit 40.

First, the control unit 11 sets a voltage of a power control signal SPG to low level. Accordingly, the power transistor 12 (FIG. 1) is put into on state, and a power voltage VDD is supplied to the memory cell 30. Then, in the SRAM circuit 40, the voltage VN1 in the node N1 tends to become the high level VH, and the voltage VN2 in the node N2 tends to become the low level VL. That is, in the SRAM circuit 40, the gate width W of the transistor 43 in the inverter IV2 is larger than the gate width W of the transistor 41 in the inverter IV1, and the gate width W of the transistor 42 in the inverter IV1 is larger than the gate width W of the transistor 44 in the inverter IV2. Accordingly, immediately after application of power, the inverter IV2 easily outputs a high level, and the inverter IV1 easily outputs a low level. Therefore, the voltage VN1 in the node N1 tends to become the high level VH, and the voltage VN2 in the node N2 tends to become the low level VL.

In the restore operation M5, as illustrated in FIG. 5, the control unit 11 sets a voltage of a power control signal SPG to low level. Furthermore, the drive unit 23 sets respective voltages of signals SCL and SSTR to high level, and sets a voltage of a signal SRST to low level. Accordingly, as illustrated in FIGS. 7C and 8C, the transistor 31 is put into on state, and the transistors 32 and 34 are both put into off state. Furthermore, the drive unit 22 sets a voltage of a signal SCTRL to the low level VL (the ground level). Accordingly, the node N1 is grounded through the transistor 31 and the storage element 35. At this time, the voltage state of the SRAM circuit 40 is determined in accordance with the resistance state of the storage element 35.

Specifically, in a case where the resistance state of the storage element 35 is the high-resistance state RH as illustrated in FIG. 7C, the node N1 is pulled down by using a high resistance value. At this time, a current flowing toward the node N1 through the transistor 43 of the inverter IV2 is larger than a current flowing from the node N1 to the control line CTL through the transistor 31 and the storage element 35. Therefore, the voltage VN1 in the node N1 becomes the high level VH. That is, the voltage VN1 is not much affected even when the node N1 is pulled down by a high resistance value, and keeps the high level VH.

Furthermore, in a case where the resistance state of the storage element 35 is the low-resistance state RL, as illustrated in FIG. 8C, the node N1 is pulled down by using a low resistance value. At this time, a current flowing toward the node N1 through the transistor 43 of the inverter IV2 is smaller than a current flowing from the node N1 to the control line CTL through the transistor 31 and the storage element 35. Therefore, the voltage VN1 in the node N1 becomes the low level VL because the node N1 is pulled down by a low resistance value.

In this way, in the memory cell 30, the SRAM circuit 40 stores therein information in accordance with information stored in the storage element 35. After that, the semiconductor circuit 1 performs the normal operation M1 as described with use of FIGS. 5 and 6A.

Here, driving in the reset operation M2 corresponds to a specific example of driving in a "first period" in the disclosure, driving in the store operation M3 corresponds to a specific example of driving in a "second period" in the disclosure, and driving in the restore operation M5 corresponds to a specific example of driving in a "third period" in the disclosure.

In this way, in the semiconductor circuit 1, for example, in a case where the standby operation M4 is performed by putting the power transistor 12 into off state, the semiconductor circuit 1 performs the store operation M3 immediately before the power transistor 12 is put into off state, thereby causing information stored in the SRAM circuit 40, which is a volatile memory, to be stored in the storage element 35, which is a non-volatile memory. Then, in a case where the normal operation M1 is performed after the standby operation M4, immediately after the power transistor 12 is put into on state, the semiconductor circuit 1 performs the restore operation M5, thereby causing information stored in the storage element 35 to be stored in the SRAM circuit 40. Accordingly, in the semiconductor circuit 1, it is possible to restore the state of each memory cell 30 to a state before the power supply is stopped, in a short time after power supply is resumed.

At this time, the semiconductor circuit 1 performs the reset operation M2 before the store operation M3, thereby resetting the resistance state of the storage element 35 to the low-resistance state RL in advance. Accordingly, in the subsequent store operation M3, the semiconductor circuit 1 only has to maintain the low-resistance state RL or change the low-resistance state RL to the high-resistance state RH; therefore, it is possible to simplify the operation.

Furthermore, in the semiconductor circuit 1, the transistors 33 and 34 are provided, and when the store operation M3 is performed, the transistor 34 is put into on state, thereby a store current Istore flows into the storage element 35 as illustrated in FIG. 7A. Accordingly, in the semiconductor circuit 1, it is possible to reduce the possibility of so-called disturbance. That is, for example, in a case where a memory cell is configured without providing the transistors 33 and 34, and in the store operation M3, the transistor 43 of the inverter IV2 supplies a store current Istore to the storage element 35 through the transistor 31, information stored in an SRAM circuit may be lost, and disturbance may occur. Furthermore, in order to avoid this, in a case where the size of each transistor in the SRAM circuit is increased, the area of the semiconductor circuit 1 is increased. On the other hand, in the semiconductor circuit 1 according to the present embodiment, when the store operation M3 is performed, the transistors 33 and 34 supply a store current Istore as illustrated in FIG. 7A. Accordingly, in the semiconductor circuit 1, it is possible to reduce the possibility of disturbance. Furthermore, it is possible to reduce the size of each transistor in the SRAM circuit 40, and therefore it is possible to reduce the area of the semiconductor circuit 1.

Moreover, in the semiconductor circuit 1, each memory cell 30 is provided with one storage element 35, and the SRAM circuit 40 is configured to cause the voltage VN1 in the node N1 to become the high level VH immediately after application of power; therefore, it is possible to reduce the area of the semiconductor circuit 1, as compared with a case of a comparative example described below.

(Comparative Example)

Subsequently, a semiconductor circuit 1R according to a comparative example is described. In this comparative example, each memory cell is provided with two storage elements.

Figure 9:
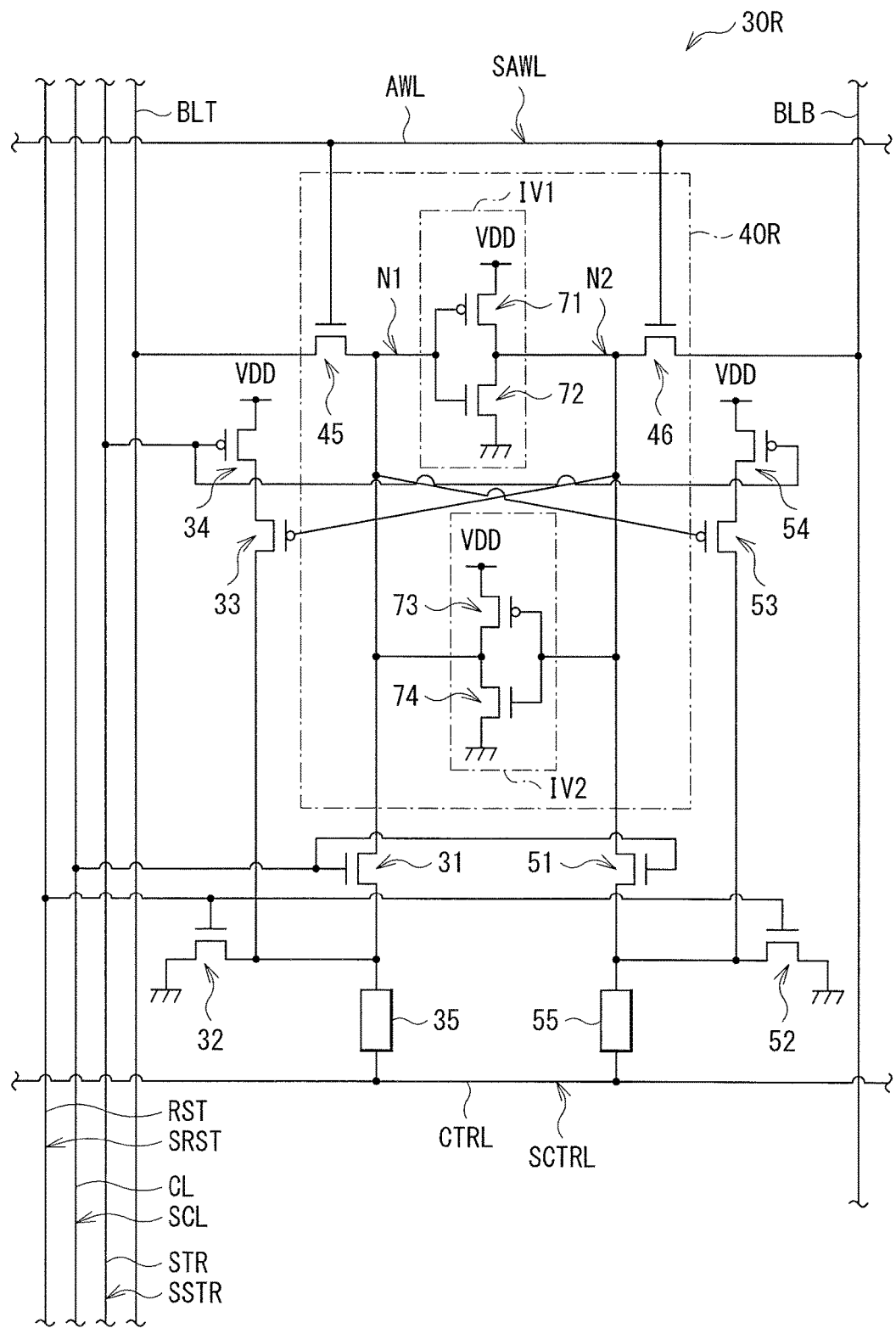
FIG. 9 is a circuit diagram representing a configuration example of a memory cell according to a comparative example.

FIG. 9 represents a configuration example of a memory cell 30R in the semiconductor circuit 1R according to the comparative example. The memory cell 30R has an SRAM circuit 40R, transistors 31 to 34 and 51 to 54, and storage elements 35 and 55.

The SRAM circuit 40R has transistors 71 to 74. The transistors 71 to 74 correspond to the transistors 41 to 44 according to the present embodiment, respectively. The transistors 71 and 72 configure the inverter IV1, and the transistors 73 and 74 configure the inverter IV2. A gate length L of the transistor 71 is equal to a gate length L of the transistor 73, and a gate width W of the transistor 71 is equal to a gate width W of the transistor 73. Furthermore, a gate length L of the transistor 72 is equal to a gate length L of the transistor 74, and a gate width W of the transistor 72 is equal to a gate width W of the transistor 74.

The transistors 51 and 52 are N-type MOS transistors, and the transistors 53 and 54 are P-type MOS transistors. A gate of the transistor 51 is coupled to a control line CL, a drain thereof is coupled to the node N2, and a source thereof is coupled to respective drains of the transistors 52 and 53 and one end of the storage element 55. A gate of the transistor 52 is coupled to a control line RST, the drain is coupled to the source of the transistor 51, the drain of the transistor 53, and one end of the storage element 55, and a source thereof is grounded. A gate of the transistor 53 is coupled to the node N1, a source thereof is coupled to a drain of the transistor 54, and the drain is coupled to the source of the transistor 51, the drain of the transistor 52, and one end of the storage element 55. A gate of the transistor 54 is coupled to a control line STR, a source thereof is supplied with a power voltage VDD, and the drain is coupled to the source of the transistor 53.

The storage element 55 is a spin transfer torque magnetic tunnel junction device, similarly to the storage element 35. One end of the storage element 55 is coupled to the source of the transistor 51 and the drains of the transistors 52 and 53, and the other end is coupled to a control line CTRL.

As in the case of the semiconductor circuit 1 according to the present embodiment (FIG. 5), the semiconductor circuit 1R according to the comparative example performs the reset operation M2, thereby resetting the resistance states of the storage elements 35 and 55 to the low-resistance state RL. Then, for example, in a case of performing the standby operation M4, the semiconductor circuit 1R, performs the store operation M3 immediately before the power transistor 12 is put into off state, thereby causing information stored in the SRAM circuit 40R to be stored in the storage elements 35 and 55, which are non-volatile memories. Accordingly, the resistance state of either one of the storage elements 35 and 55 is maintained in the low-resistance state RL, and the resistance state of the other storage element becomes the high-resistance state RH. Then, in a case of performing the normal operation M1 after the standby operation M4, the semiconductor circuit 1R performs the restore operation M5 immediately after the power transistor 12 is put into on state, thereby causing information stored in the storage elements 35 and 55 to be stored in the SRAM circuit 40.

In the semiconductor circuit 1R according to the comparative example, each memory cell 30R is provided with two storage elements 35 and 55 and eight transistors 31 to 34 and 51 to 54. Therefore, in the semiconductor circuit 1R, because the number of elements is large, the area of the memory cell 30R is increased. As a result, the area of the semiconductor circuit 1R is also increased.

In contrast, in the semiconductor circuit 1 according to the present embodiment, each memory cell 30 is provided with one storage element 35 and four transistors 31 to 34, and the SRAM circuit 40 is configured to cause the voltage VN1 in the node N1 to become the high level VH immediately after application of power. In other words, the storage element 55 and four transistors 51 to 54 are eliminated, and the SRAM circuit 40R is replaced with the SRAM circuit 40, in the semiconductor circuit 1R according to the comparative example. Accordingly, in the semiconductor circuit 1, it is possible to reduce the number of elements, and therefore reduce the area of the memory cell 30, a result of which, it is possible to reduce the area of the semiconductor circuit 1.

In the semiconductor circuit 1, in particular, the SRAM circuit 40 is configured to cause the voltage VN1 in the node N1 to easily become the high level VH immediately after application of power; therefore, one storage element 35 makes it possible to realize the restore operation M5.

In other words, in the semiconductor circuit 1R according to the comparative example, for example, in a case where the resistance state of the storage element 35 is the high-resistance state RH, and the resistance state of the storage element 55 is the low-resistance state RL, the node N2 is pulled down by a low resistance value through the restore operation M5, and therefore the voltage VN2 in the node N2 becomes the low level VL, and as a result, the voltage VN1 in the node N1 becomes the high level VH. However, in the configuration in which the transistors 51 to 54 and the storage element 55 are simply eliminated from the memory cell 30R according to the comparative example, it is difficult to bring the voltage VN1 in the node N1 to the high level VH even when the restore operation M5 is going to be performed.

In contrast, in the semiconductor circuit 1, the SRAM circuit 40 is configured to cause the voltage VN1 in the node N1 to easily become the high level VH immediately after application of power. Accordingly, in a case where the resistance state of the storage element 35 is the high-resistance state RH, the voltage VN1 becomes the high level VH in the restore operation M5. That is, the voltage VN1 is not much affected even when the node N1 is pulled down by a high resistance value, and keeps the high level VH. Then, in a case where the resistance state of the storage element 35 is the low-resistance state RL, because the node N1 is pulled down by a low resistance value in the restore operation M5, the voltage VN1 becomes the low level VL. Accordingly, in the semiconductor circuit 1, one storage element 35 makes it possible to realize the restore operation M5.

[Effects]

As described above, in the present embodiment, the transistors 33 and 34 are provided, and when a store operation is performed, the transistor 34 is put into on state, thereby a store current flows into a storage element; therefore, it is possible to reduce the possibility of disturbance.

In the present embodiment, each memory cell is provided with one storage element, and an SRAM circuit is configured to cause the voltage VN1 in the node N1 to easily become the high level VH immediately after application of power; therefore, it is possible to reduce the area of a semiconductor circuit.

In the present embodiment, an SRAM circuit is configured to cause the voltage VN1 in the node N1 to easily become the high level VH immediately after application of power; therefore, one storage element makes it possible to realize a restore operation.

MODIFICATION EXAMPLE 1

In the above-described embodiment, by setting respective gate widths W of the transistors 41 to 44 in the inverters IV1 and IV2, the voltage VN1 in the node N1 is configured to easily become the high level VH immediately after application of power; however, the configuration is not limited to this. Alternatively, for example, by setting respective gate lengths L of the transistors 41 to 44 in the inverters IV1 and IV2, the voltage VN1 in the node N1 may be configured to easily become the high level VH immediately after application of power. Specifically, for example, the gate length L of the transistor 43 in the inverter IV2 may be made shorter than that of the transistor 41 in the inverter IV1, and the gate length L of the transistor 42 in the inverter IV1 may be made shorter than that of the transistor 44 in the inverter IV2.

MODIFICATION EXAMPLE 2

In the above-described embodiment, the gate width W of the transistor 43 in the inverter IV2 is larger than that of the transistor 4i in the inverter IV1 and the gate width W of the transistor 42 in the inverter IV1 is larger than that of the transistor 44 in the inverter IV2; however, the configuration is not limited to this. Alternatively, the gate widths W of the transistors 42 and 44 may be equal to each other, and the gate width W of the transistor 43 in the inverter IV2 may be made larger than that of the transistor 41 in the inverter IV1. Furthermore, for example, the gate widths W of the transistors 41 and 43 may be equal to each other, and the gate width W of the transistor 42 in the inverter IV1 may be made larger than that of the transistor 44 in the inverter IV2.

MODIFICATION EXAMPLE 3

Figure 10:
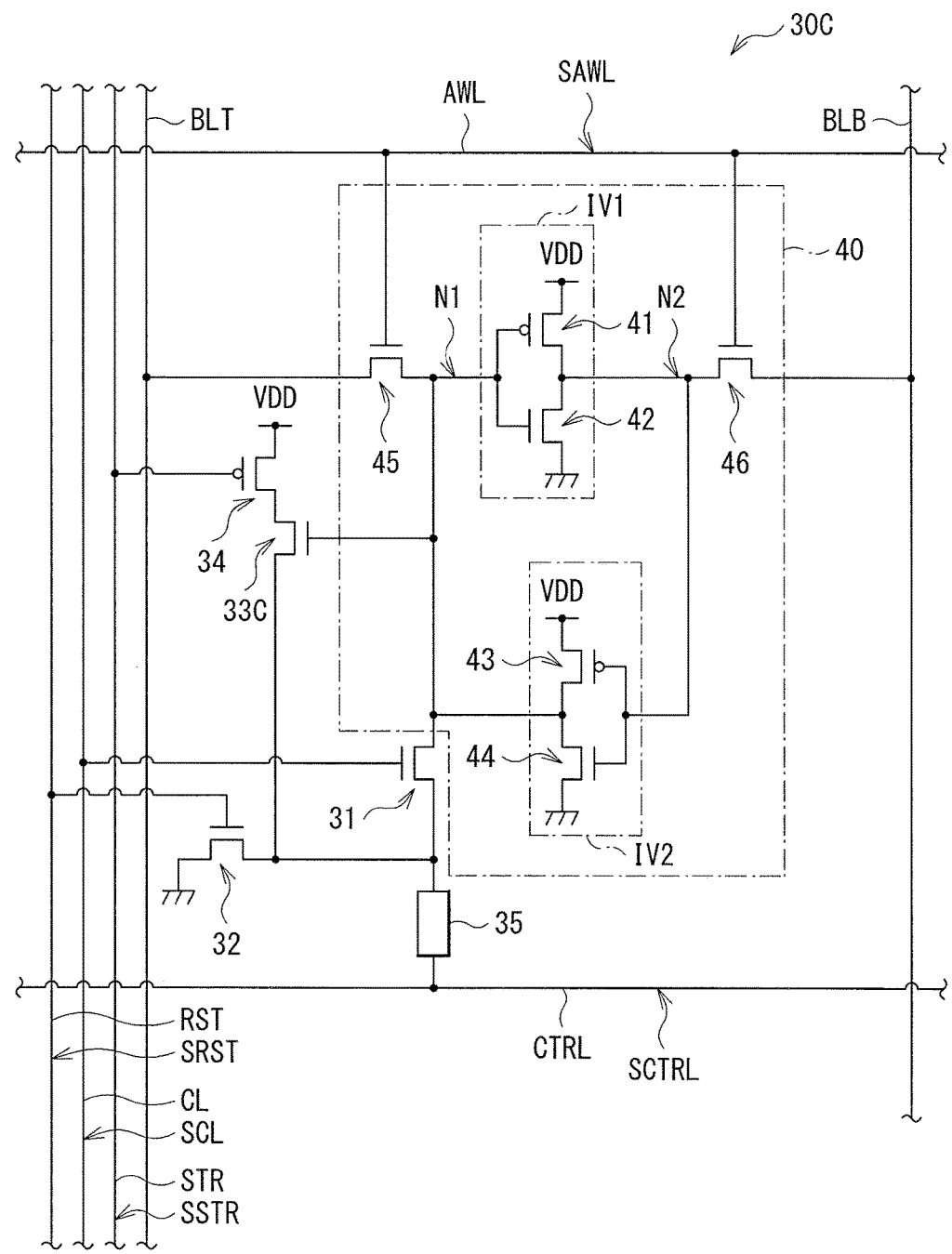
FIG. 10 is a circuit diagram representing a configuration example of a memory cell according to a modification example.

In the above-described embodiment, a P-type MOS transistor is used to configure the transistor 33; however, it is not limited to this. Alternatively, for example, an N-type MOS transistor may be used to configure a transistor 33C, similarly to a memory cell 30C illustrated in FIG. 10. A gate of the transistor 33C is coupled to the node N1, a drain thereof is coupled to the drain of the transistor 34, and a source thereof is coupled to the source of the transistor 31, the drain of the transistor 32, and one end of the storage element 35. That is, in this modification example, an N-type MOS transistor is used to configure the transistor 33C, and the gate of the transistor 33C is coupled to the node N1 in consideration of the voltage VN1 in the node N1 and the voltage VN2 in the node N2 being inverted to each other.

MODIFICATION EXAMPLE 4

Figure 11:
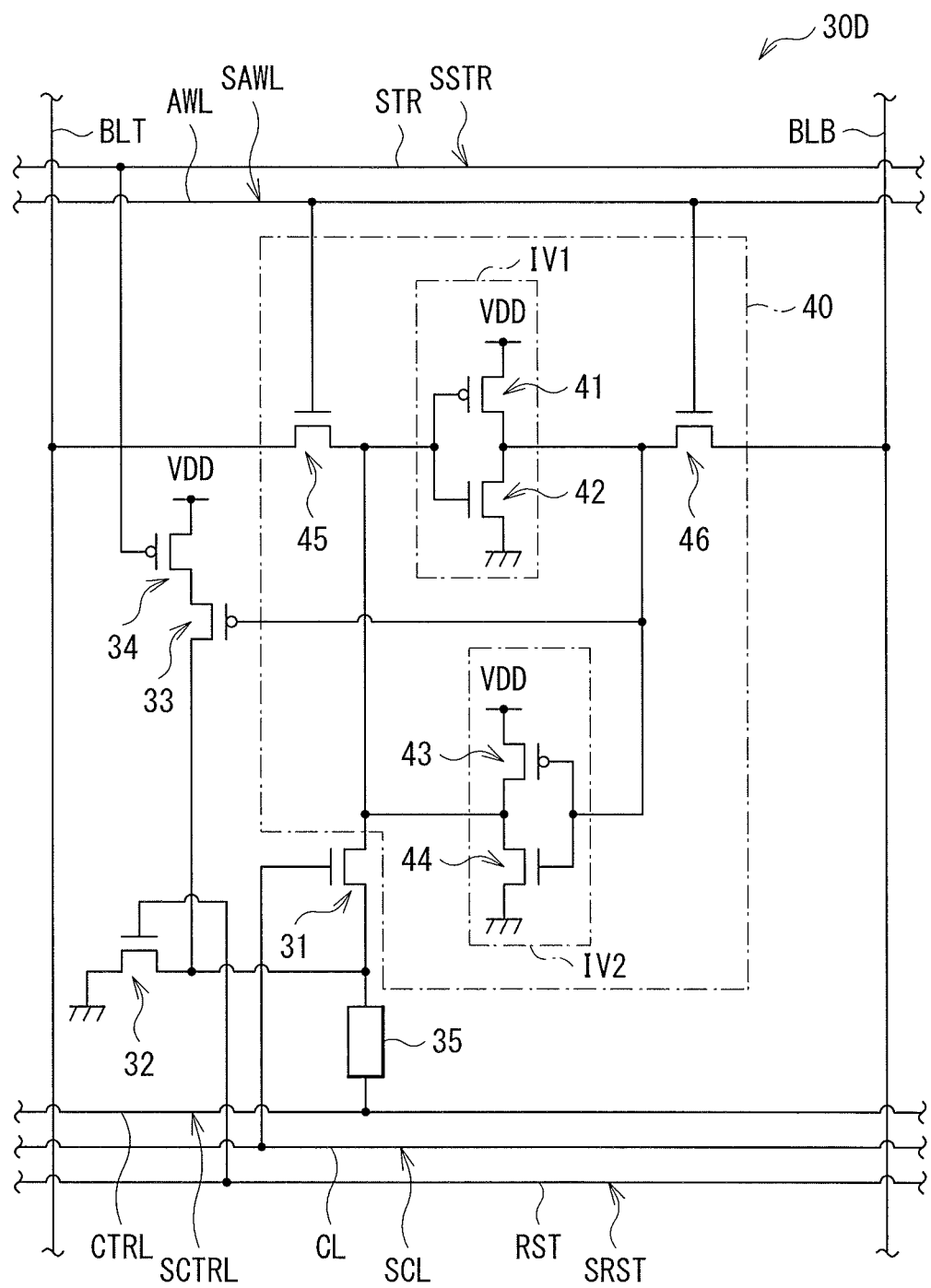
FIG. 11 is a circuit diagram representing a configuration example of a memory cell according to another modification example.

In the above-described embodiment, the word lines AWL and the control lines CTRL are configured to extend in the lateral direction in FIGS. 2 and 3, and the hit lines BLT and BLB and the control lines RST, CL, and STR are configured to extend in the longitudinal direction in FIGS. 2 and 3; however, the configuration is not limited to this. For example, they may be configured to be similar to a memory cell 30D illustrated in FIG. 11. A memory cell array 21A including memory cells 30A according to this modification example has the word lines AWL, the control lines CTRL, the control lines RST, CL, and STR, and the bit lines BLT and BLB. In this example, the control lines RST extend in a lateral direction in FIG. 11, and one ends of the control lines RST are coupled to a drive unit 22D according to this modification example. The control lines CL extend in the lateral direction in FIG. 11, and one ends of the control lines CL are coupled to the drive unit 22D. The control lines STR extend in the lateral direction in FIG. 11, and one ends of the control lines STR are coupled to the drive unit 22D.

MODIFICATION EXAMPLE 5

Figure 12:
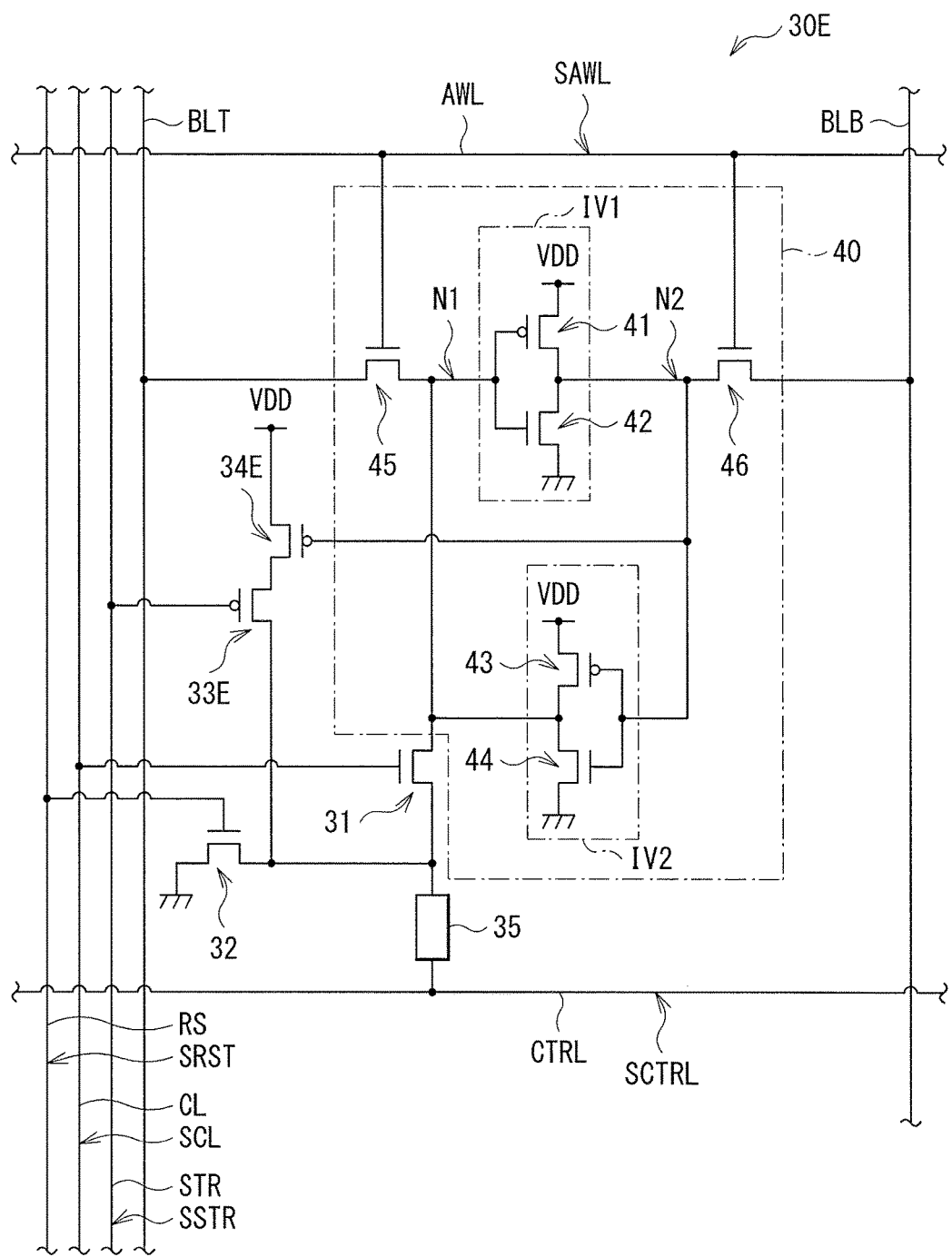
FIG. 12 is a circuit diagram representing a configuration example of a memory cell according to another modification example.

In the above-described embodiment, of the transistors 33 and 34, the transistor 34 supplied with a power voltage VDD is turned on/off by a signal SSTR; however, the configuration is not limited to this. Alternatively, for example, they may be configured to be similar to a memory cell 30E illustrated in FIG. 12. This memory cell 30E includes transistors 33E and 34E. The transistors 33E and 34E are P-type MOS transistors. A gate of the transistor 33E is coupled to a control line STR, a source thereof is coupled to a drain of the transistor 34E, and a drain thereof is coupled to the source of the transistor 31, the drain of the transistor 32, and one end of the storage element 35. A gate of the transistor 34E is coupled to the node N2, a source thereof is supplied with a power voltage VDD, and the drain is coupled to the source of the transistor 33E.

MODIFICATION EXAMPLE 6

In the above-described embodiment, the storage element 35 having a bottom pin structure in which the free layer F, the tunnel barrier layer I, and the pinned layer P are stacked in this order from the upper layer side is used; however, it is not limited to this. This modification example is described in detail below.

Figure 13:
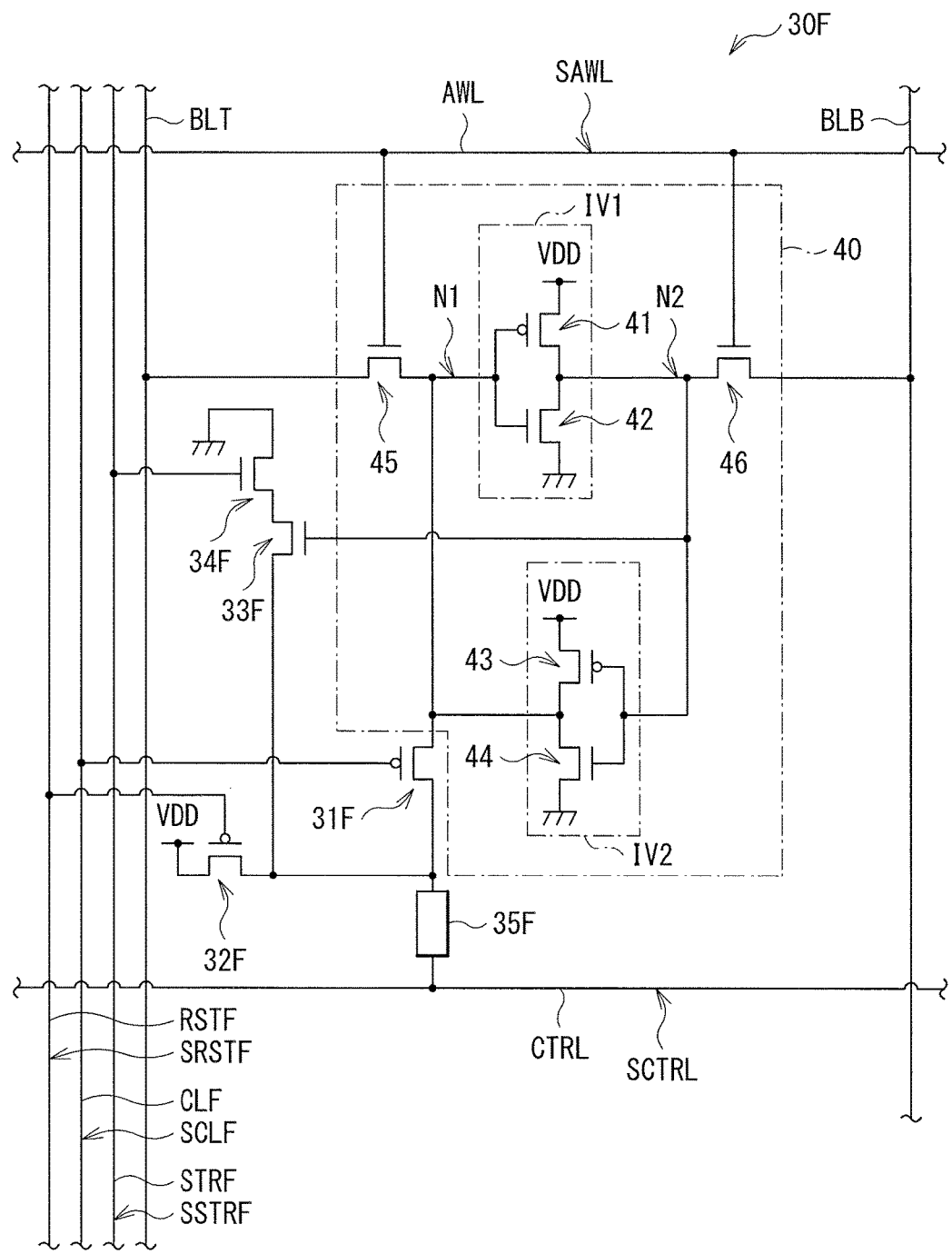
FIG. 13 is a circuit diagram representing a configuration example of a memory cell according to another modification example.

FIG. 13 represents a configuration example of a memory cell 30F according to this modification example. A memory cell array 21F including these memory cells 30F has the word lines AWL, the control lines CTRL, the bit lines BLT, the bit lines BLB, control lines RSTF, control lines CLF, and control lines STRF. The memory cell 30F has the SRAM circuit 40, transistors 31F to 34F, and a storage element 35F.

The transistors 31F and 32F are P-type MOS transistors, and the transistors 33F and 34F are N-type MOS transistors. The transistors 31F to 34F correspond to the transistors 31 to 34 according to the above-described embodiment, respectively. A source of the transistor 32F is supplied with a power voltage VDD, and a source of the transistor 34F is grounded.

Figure 14:
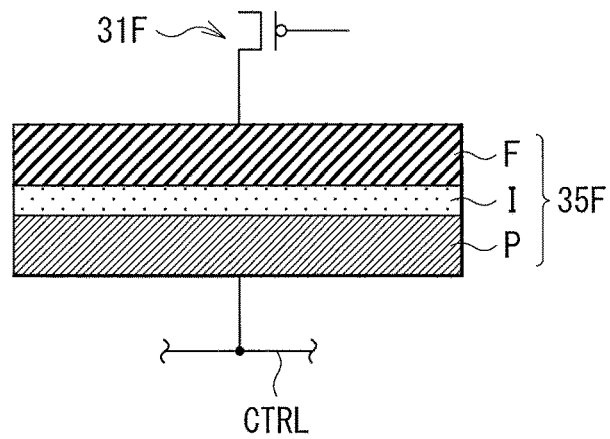
FIG. 14 is an explanatory diagram representing a configuration example of a storage element illustrated in FIG. 13.

FIG. 14 represents a configuration example of the storage element 35F. The storage element 35F has the pinned layer P, the tunnel barrier layer I, and the free layer F. In this example, the free layer F is coupled to the transistors 31F, 32F, and 33F disposed on the lower layer side of the chip, and the pinned layer P is coupled to a control line CTRL disposed on the upper layer side. That is, the storage element 35F has a so-called top pin structure in which the pinned layer P, the tunnel barrier layer I, and the free layer F are stacked in this order from the upper layer side.

This configuration also makes it possible to achieve similar effects to those in the above-described embodiments.

MODIFICATION EXAMPLE 7

Figure 15:
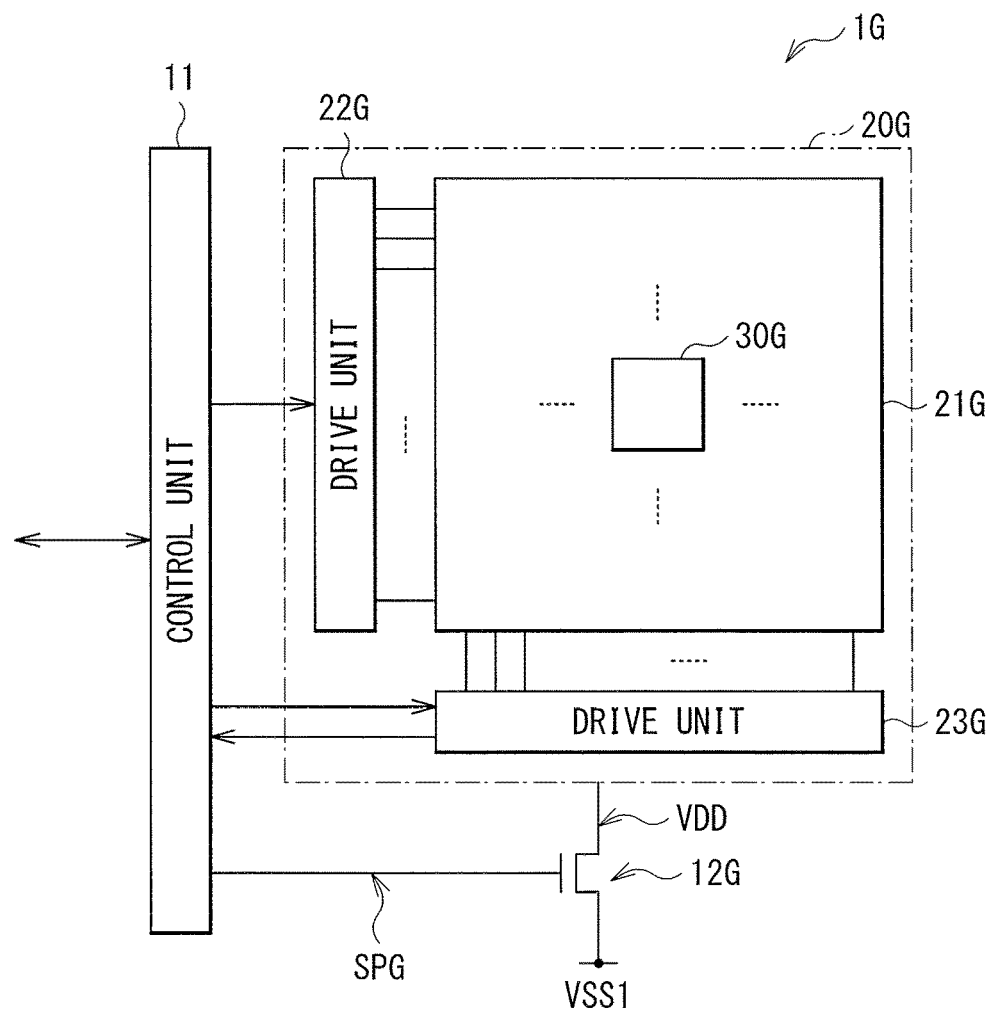
FIG. 15 is a block diagram representing a configuration example of a semiconductor circuit according to another modification example.

In the above-described embodiment, a P-type MOS transistor is used to configure the power transistor 12; however, the configuration is not limited to this. Alternatively, for example, a power transistor may include an N-type MOS transistor, as in a semiconductor circuit 1G illustrated in FIG. 15. The semiconductor circuit 1G includes a power transistor 12G and a memory circuit 20G. The power transistor 12G is an N-type MOS transistor in this example; a gate of the power transistor 12G is supplied with a power control signal SPG, a drain thereof is coupled to the memory circuit 20G, and a source thereof is supplied with a ground voltage VSS1. By this configuration, in the semiconductor circuit 1G, in a case of using the memory circuit 20G, the power transistor 12G is put into on state, and a ground voltage VSS1 is supplied as a ground voltage VSS to the memory circuit 20G. Furthermore, in the semiconductor circuit 1G, in a case of not using the memory circuit 20G, the power transistor 12G is put into off state. The memory circuit 20G has a memory cell array 21G and drive units 22G and 23G. The memory cell array 21G has a plurality of memory cells 30G. It is possible for the memory cells 30G to use a configuration in which, for example, the storage element 35 in the memory cell 30 illustrated in FIG. 2 is replaced with the storage element 35F having a top pin structure.

MODIFICATION EXAMPLE 8

In the above-described embodiment, each memory cell 30 is provided with the transistor 34; however, the configuration is not limited to this. A memory circuit 20I4 according to this modification example is described in detail below. The memory circuit 20H has a memory cell array 21H and drive units 22 and 23H.

Figure 16:
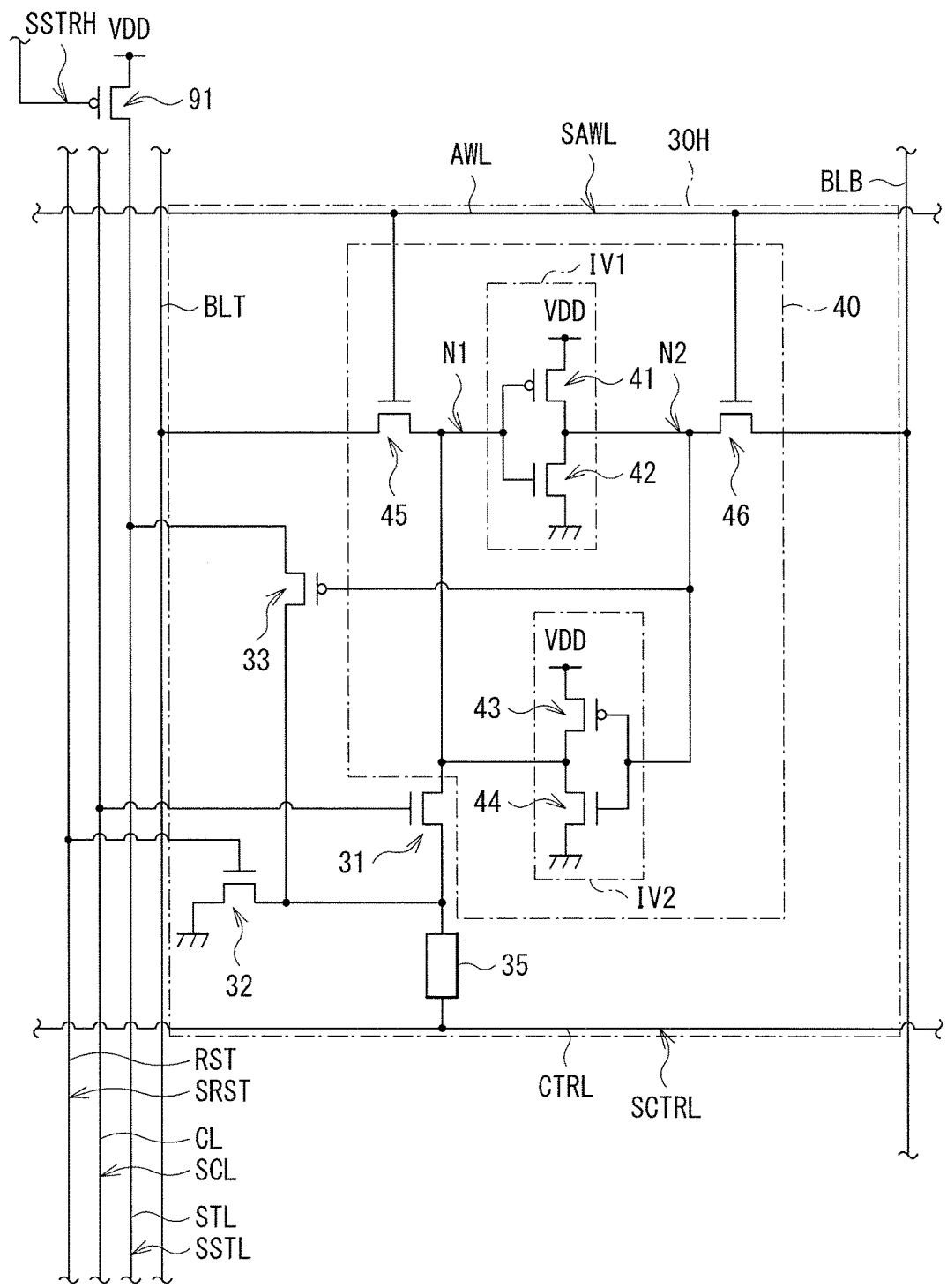
FIG. 16 is a circuit diagram representing a configuration example of a memory cell according to another modification example.
Figure 17:
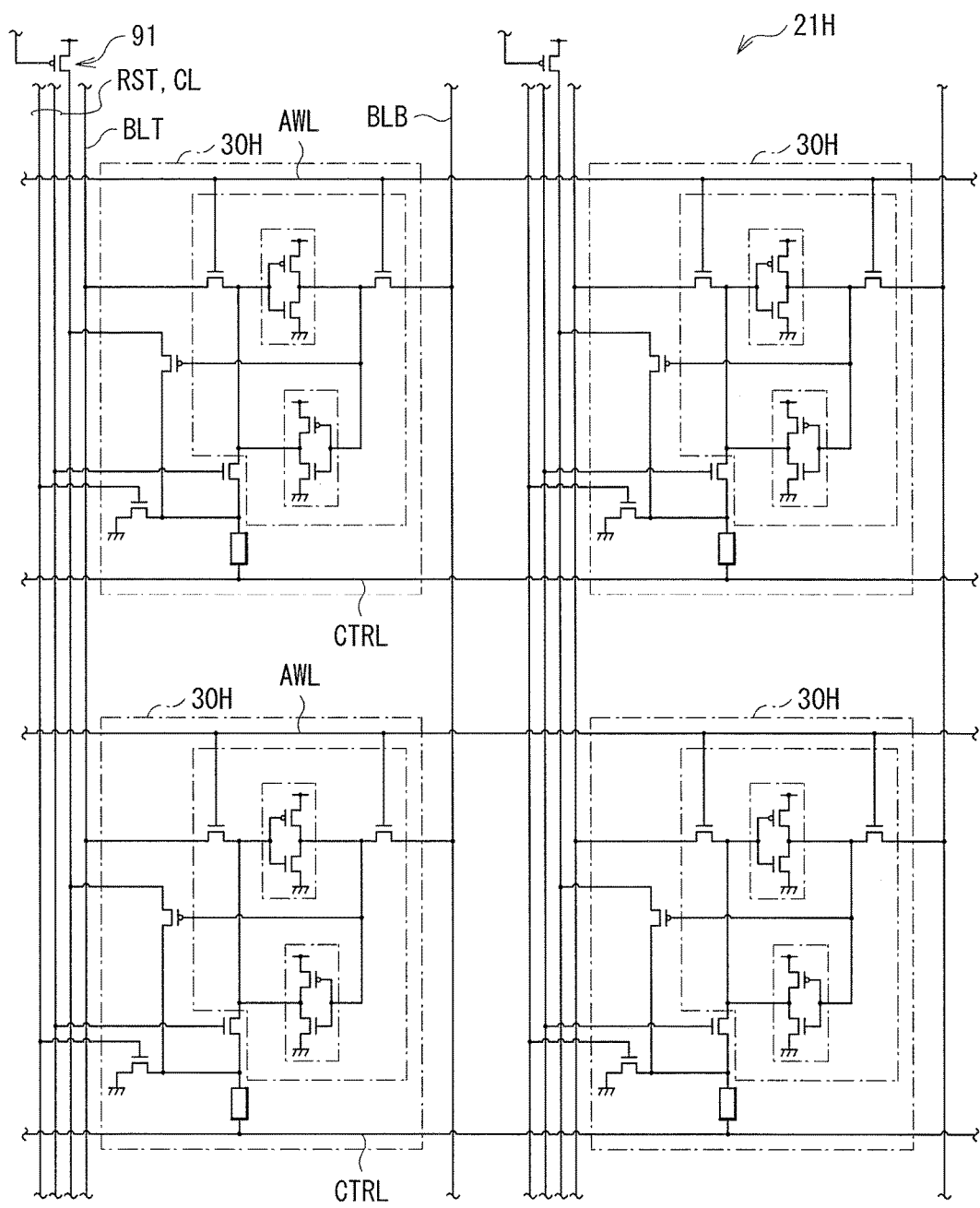
FIG. 17 is a circuit diagram representing a configuration example of a memory cell array having the memory cell illustrated in FIG. 16.
Figure 18A:
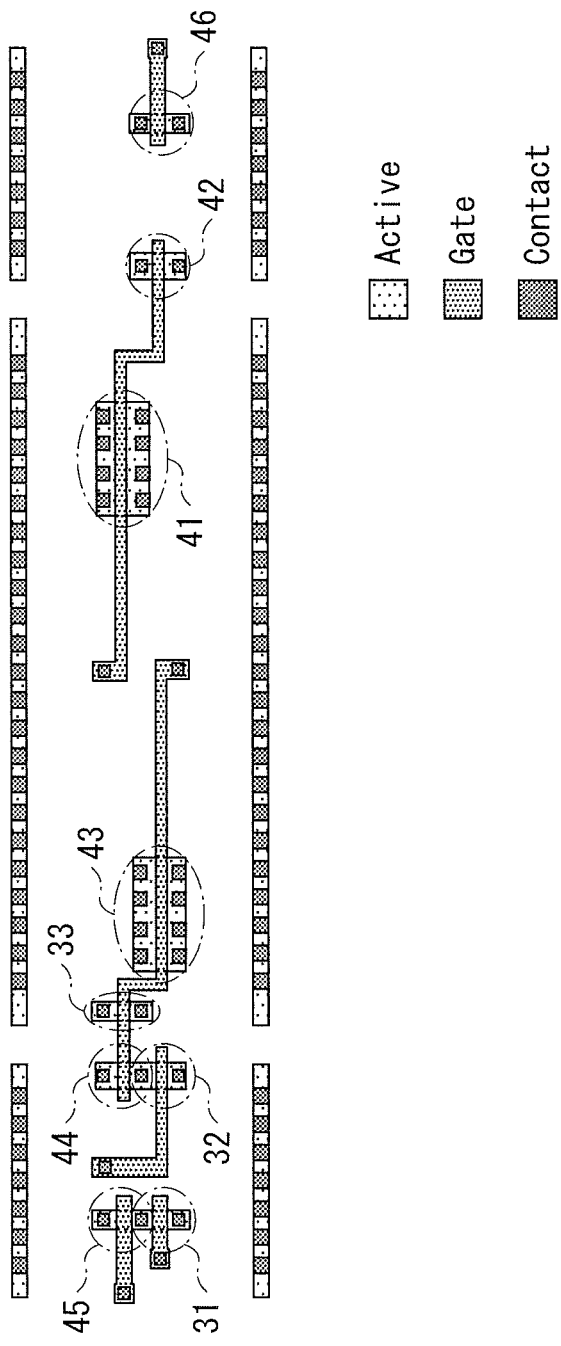
FIG. 18A is a layout diagram representing a configuration example of the memory cell illustrated in FIG. 16.
Figure 18B:
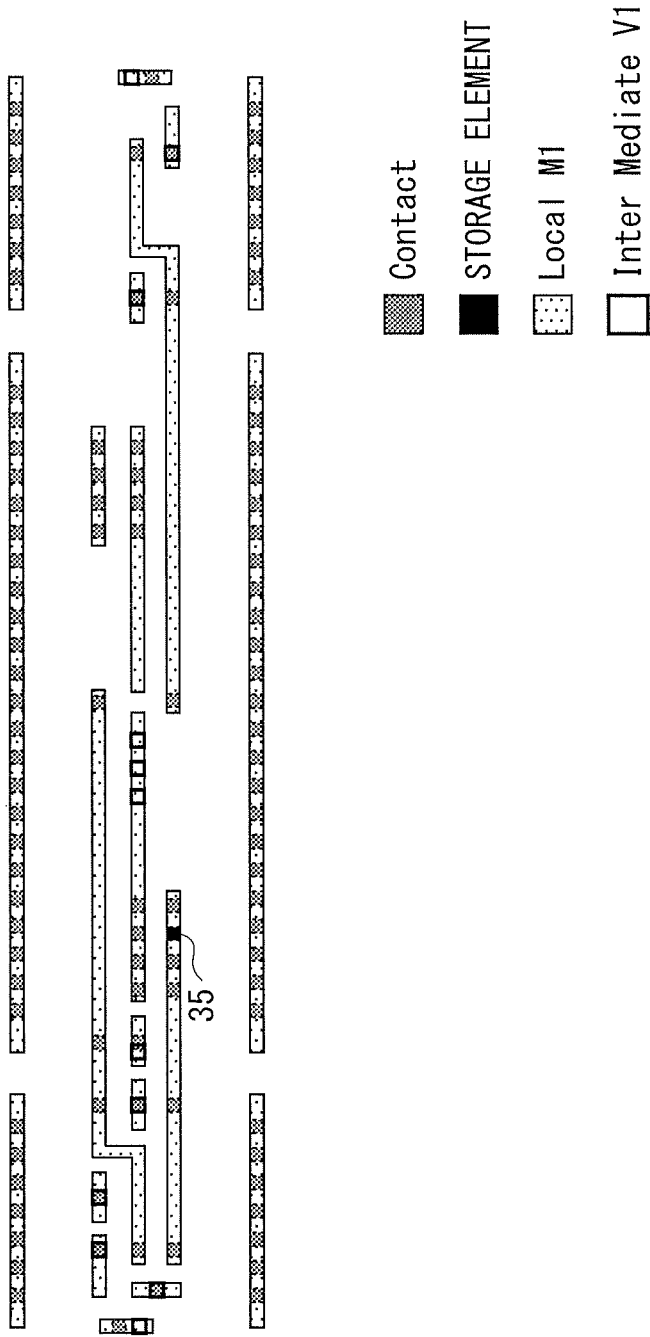
FIG. 18B is another layout diagram representing a configuration example of the memory cell illustrated in FIG. 16.
Figure 18C:
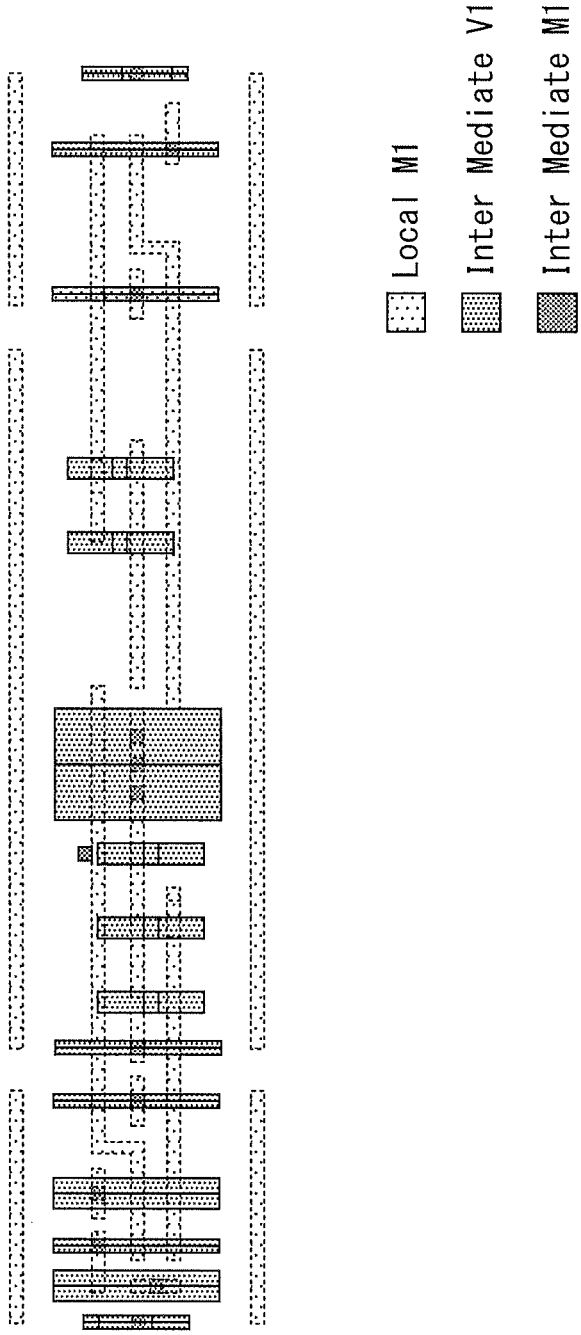
FIG. 18C is another layout diagram representing a configuration example of memory cell illustrated in FIG. 16.
Figure 18D:
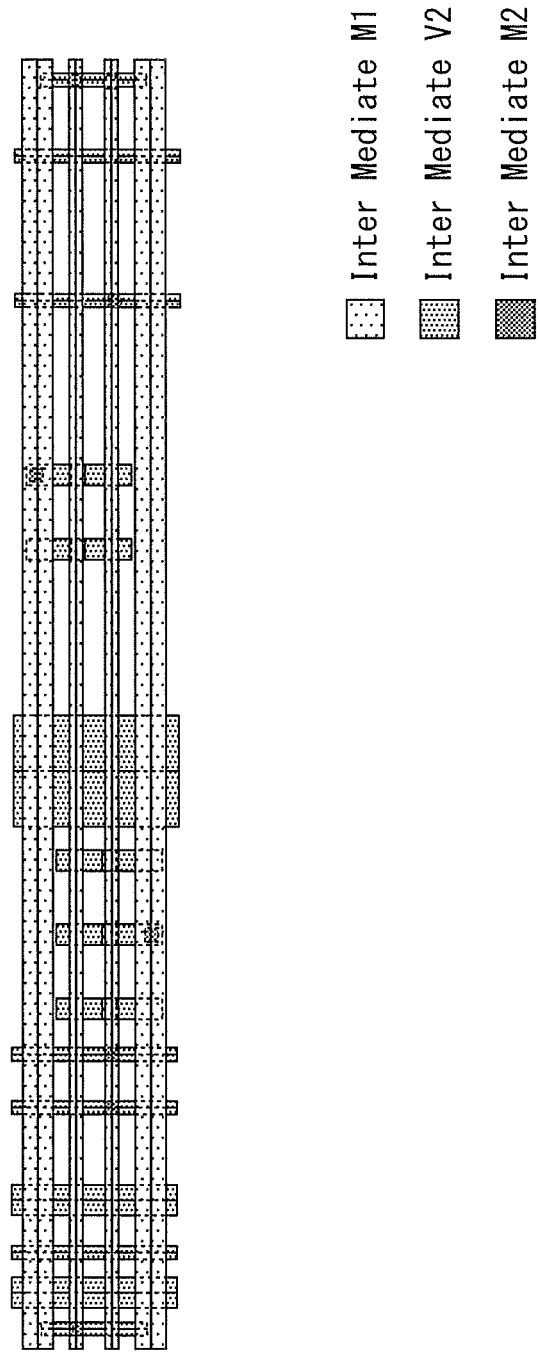
FIG. 18D is another layout diagram representing a configuration example of the memory cell illustrated in FIG. 16.

FIG. 16 represents a configuration example of a memory cell 30H in the memory cell array 21H. FIG. 17 represents a configuration example of the memory cell array 21H. FIGS. 18A to 18D represent an example of a layout of the memory cell 30H; FIG. 18A illustrates a layout of Active, Gate, and Contact layers, FIG. 18B illustrates a layout of Contact, storage element, LocalM1, and InterMediateV1 layers, FIG. 18C illustrates a layout of LocalM1, InterMediateV1, and InterMediateM1 layers, and FIG. 18D illustrates a layout of InterMediateM1, InterMediateV2, and InterMediateM2 layers.

The memory cell array 21H has the multiple word lines AWL, the multiple control lines CTRL, the multiple bit lines BLT, the multiple bit lines BLB, the multiple control lines RST, the multiple control lines CL, multiple control lines STL, and a transistor 91. The control lines STL extend in a longitudinal direction in FIGS. 16 and 17, and one ends of the control lines STI, are coupled to a drain of the transistor 91. The transistor 91 is a P-type MOS transistor, and corresponds to the transistor 34 in the memory cell 30 (FIG. 2). A gate of the transistor 91 supplied with a signal SSTRH from the drive unit 23H, a source thereof is supplied with a power voltage VDD, and the drain is coupled to a control line STL.

The memory cell 30H has the SRAM circuit 40, the transistors 31 to 33, and the storage element 35. A source of the transistor 33 is coupled to the control line STL.

MODIFICATION EXAMPLE 9

Figure 19:
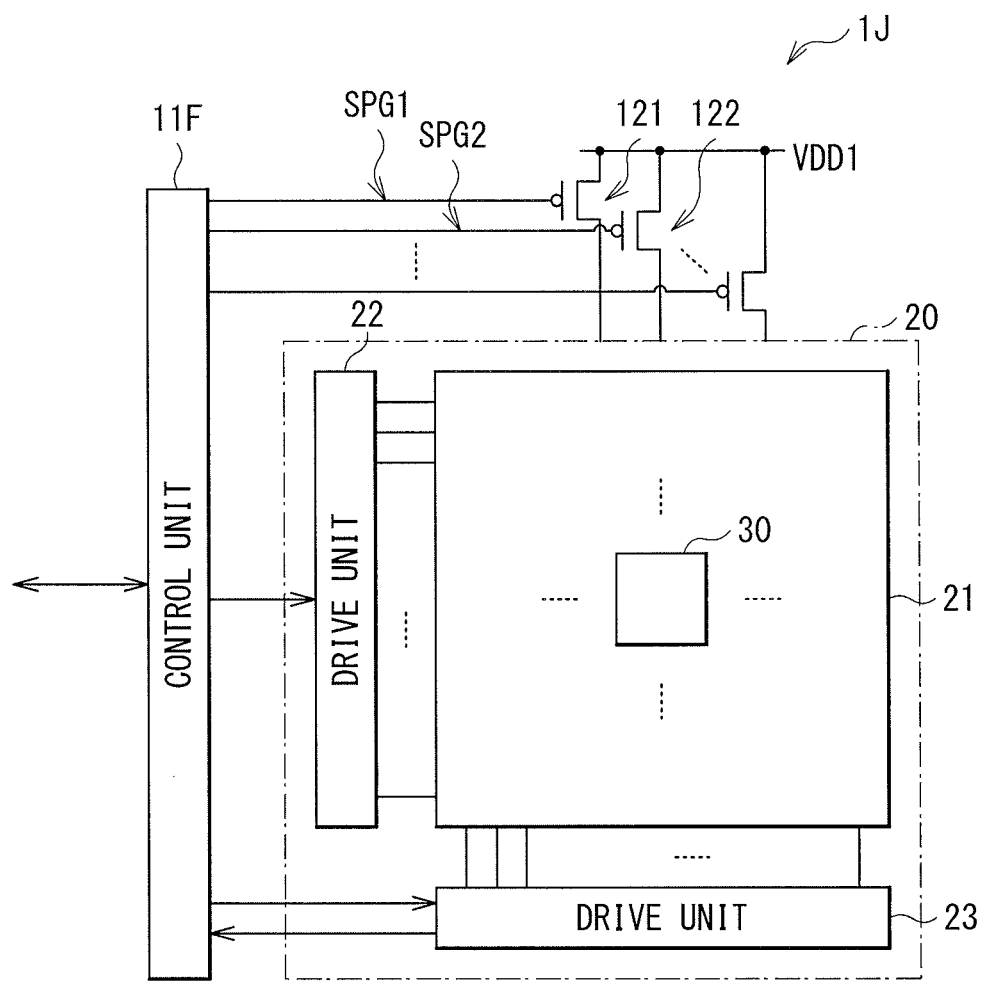
FIG. 19 is a block diagram representing a configuration example of a semiconductor circuit according to another modification example.
Figure 20A:
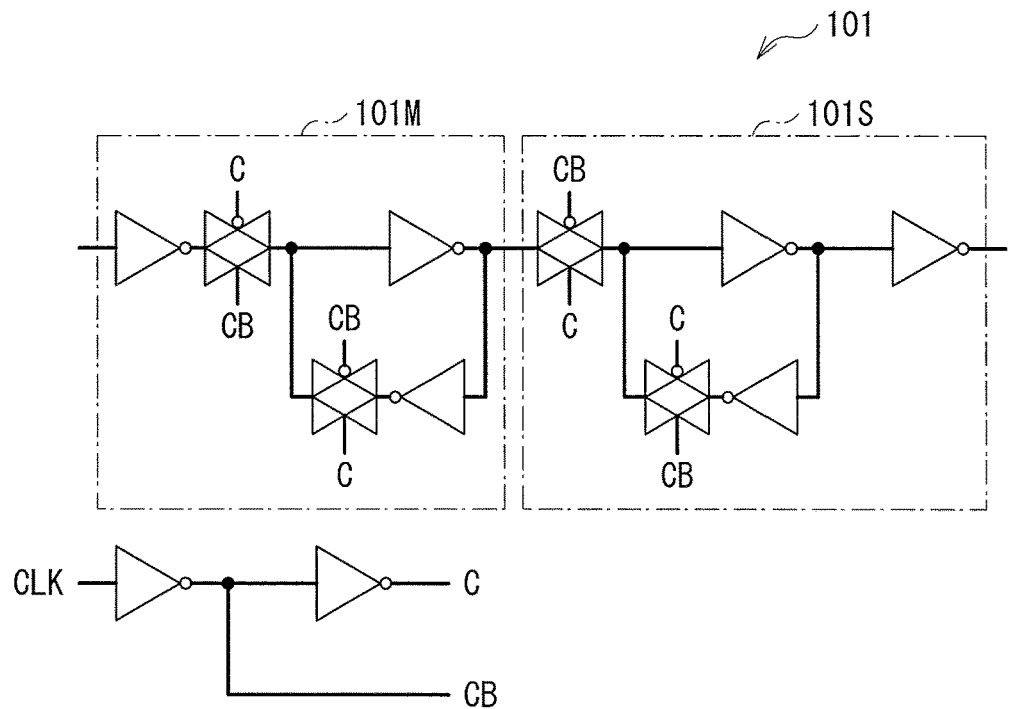
FIG. 20A is a circuit diagram representing a configuration example of a flip-flop circuit.
Figure 20B:
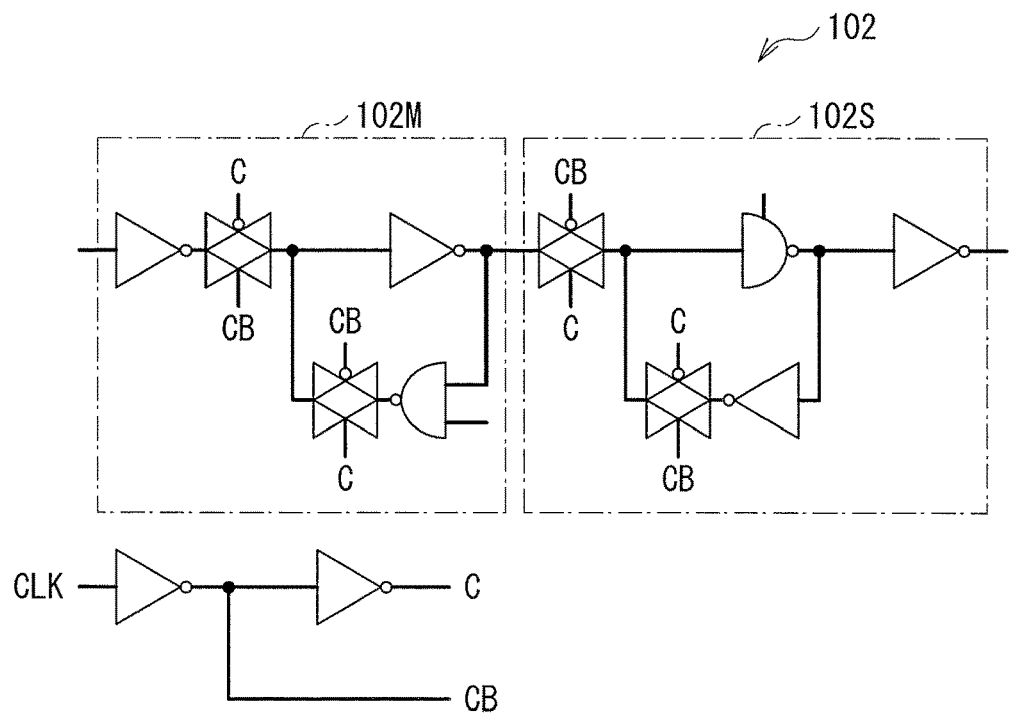
FIG. 20B is a circuit diagram representing another configuration example of a flip-flop circuit.
Figure 20C:
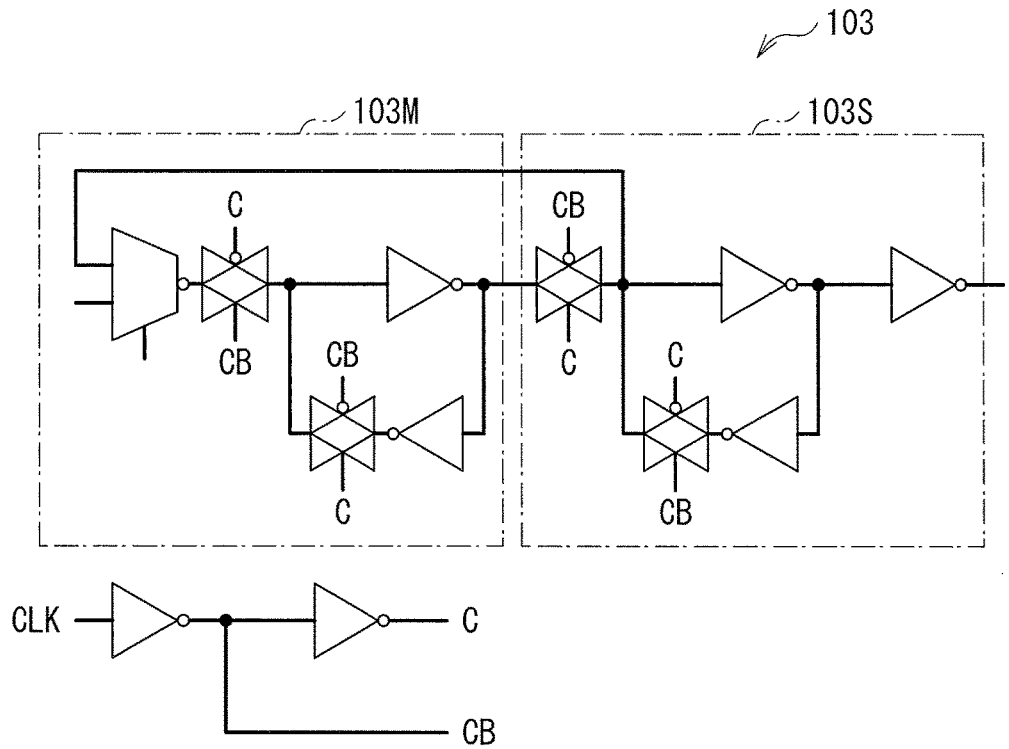
FIG. 20C is a circuit diagram representing another configuration example of a flip-flop circuit.
Figure 20D:
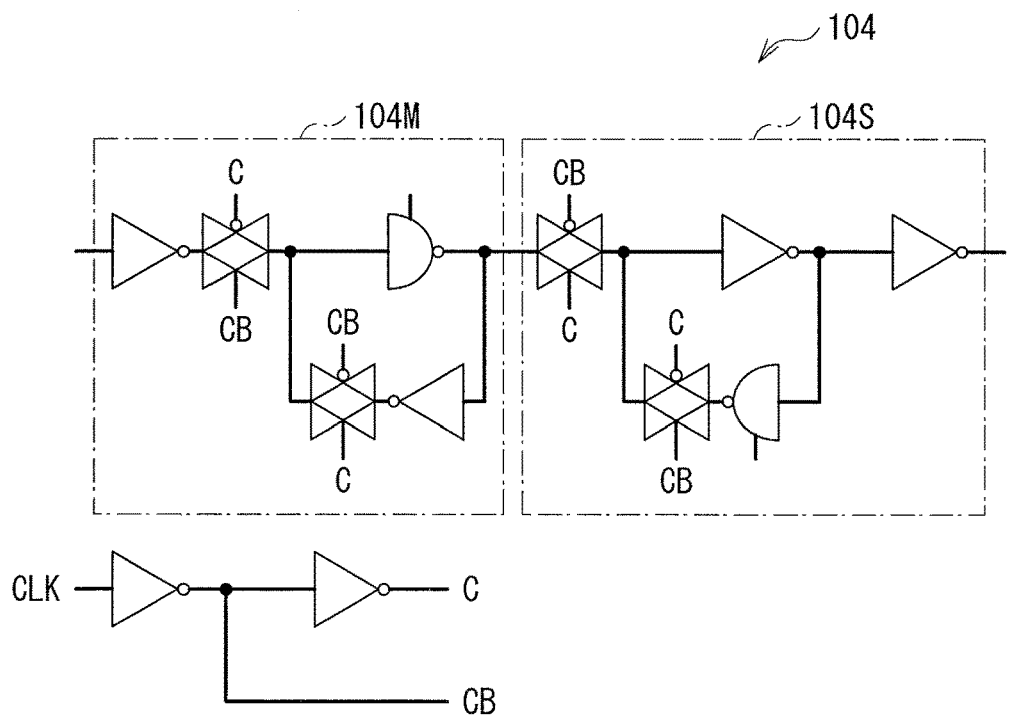
FIG. 20D is a circuit diagram representing another configuration example of a flip-flop circuit.

In the above-described embodiment, one power transistor 12 is provided; however, the configuration is not limited to this. Alternatively, for example, a plurality of power transistors may be provided, as in a semiconductor circuit 1J illustrated in FIG. 19. The semiconductor circuit 1J includes a control unit 11J and a plurality of power transistors 121, 122, . . . . The control unit 11J supplies power control signals SPG, SPG2, . . . to the power transistors 121, 122, . . . , respectively, and turns the power transistors 121, 122, . . . on/off, thereby controlling power supply to the memory circuit 20. The plurality of power transistors 121, 122, . . . are provided to correspond to a plurality of banks in the memory circuit 20. Accordingly, in the semiconductor circuit 1J, it is possible to control the power supply, with a bank unit of the memory circuit 20.

MODIFICATION EXAMPLE 10

In the above-described embodiment, a spin transfer torque magnetic tunnel junction device is used to configure the storage element 35; however, the storage element 35 is not limited to this, and any type of device may be used as long as its resistance state reversibly changes in accordance with a direction of a current flowing. Specifically, for example, a memory device including a stack of an ion source layer and a resistance change layer used in a ferroelectric memory device or an atomic random access memory (ARAM) may be used.

OTHER MODIFICATION EXAMPLES

Furthermore, of these modification examples, two or more may be combined.
<2. Application Example and Practical Application Example>
Subsequently, an application example of the technology described in the above embodiment and modification examples and a practical application example to an electronic apparatus are described.
(Application Example)
In the above-described embodiment, the technology is applied to the SRAM circuit 40; however, it is not limited to this. For example, the technology may be applied to, for example, flip-flop circuits 101 to 104 illustrated in FIGS. 20A to 20D. The flip-flop circuit 101 is a so-called master-slave D-type flip-flop circuit having a master latch circuit 101M and a slave latch circuit 104M. The same applies to the flip-flop circuits 102 to 104.

Figure 21:
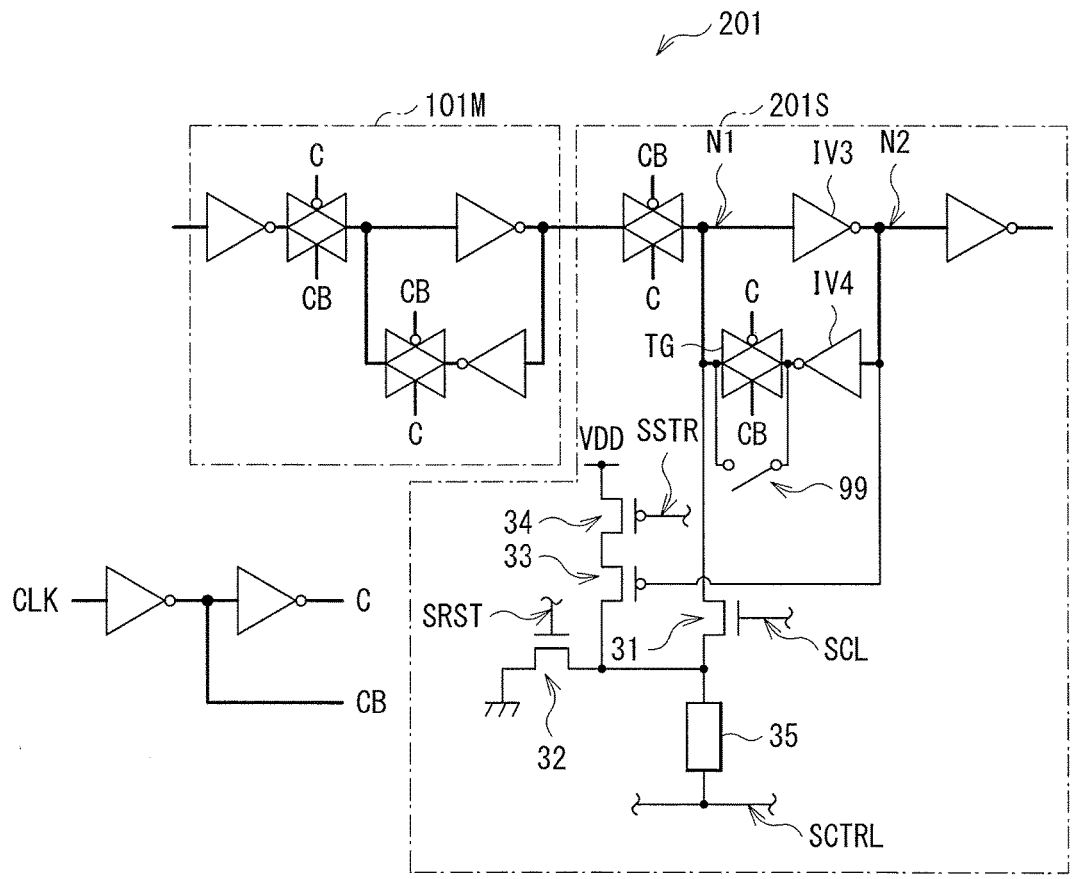
FIG. 21 is a circuit diagram representing a configuration example of a flip-flop circuit to which the embodiment is applied.

FIG. 21 is a configuration example of a flip-flop circuit 201 according to this application example. The flip-flop circuit 201 is based on the application of the technology according to the above-described embodiment to the flip-flop circuit 101 illustrated in FIG. 20A. The flip-flop circuit 201 has the master latch circuit 101M and a slave latch circuit 201S. The technology according to the above-described embodiment is applied to this slave latch circuit 201S. The slave latch circuit 201S has inverters IV3 and IV4, a transmission gate TG, a switch 99, the transistors 31 to 33, and the storage element 35. An input terminal of the inverter IV3 is coupled to the node N1, and an output terminal is coupled to the node N2. An input terminal of the inverter IV4 is coupled to the node N2, and an output terminal is coupled to one end of the transmission gate TG and one end of the switch 99. One end of the transmission gate TG is coupled to the output terminal of the inverter IV4 and one end of the switch 99, and the other end is coupled to the node N1. One end of the switch 99 is coupled to the output terminal of the inverter IV4 and one end of the transmission gate TG, and the other end is coupled to the node N1. In a case where the normal operation M1 is performed, the switch 99 is put into off state; and in cases where the store operation M3 and the restore operation M5 are performed, the switch 99 is put into on state. The inverters IV3 and IV4 are configured to cause the voltage VN1 in the node N1 to become the high level VH immediately after application of power.

It is to be noted that in this example, the technology according to the above-described embodiment is applied to a slave latch circuit; however, this is non-limiting. Alternatively, for example, the technology according to the above-described embodiment may be applied to a master latch circuit.

(Practical Application Example to Electronic Apparatus)

Figure 22:
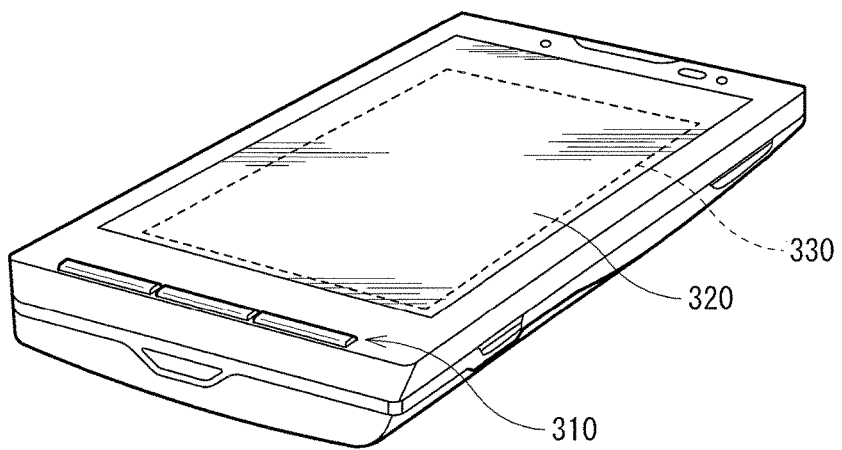
FIG. 22 is a perspective view representing a configuration of an external appearance of a smartphone to which the embodiment is applied.

FIG. 22 represents an external appearance of a smartphone to which the semiconductor circuit in the above-described embodiments, etc. is applied. This smartphone has, for example, a body unit 310, a display unit 320, and a battery 330.

The semiconductor circuit in the above-described embodiments, etc. can be applied to electronic apparatuses in all fields, such as a digital camera, a notebook-sized personal computer, a handheld game console, and a video camera, besides such a smartphone. The technology is particularly effective in application to a portable electronic apparatus having a battery.

Some embodiments and modification examples, and the specific application example and the practical application example to an electronic apparatus of these are described above; however, the technology is not limited to this embodiment, etc. and it is possible to make various modifications.

For example, in the above-described embodiments, etc., the resistance state of the storage element 35 is put into the low-resistance state RL by performing the reset operation M2; however, the configuration is not limited to this. Alternatively, the resistance state of the storage element 35 may be put into the high-resistance state RH by performing the reset operation M2.

Furthermore, for example, in the above-described application example, the technology is applied to a D-type flip-flop circuit; however, it is not limited to this, and, for example, may be applied to another flip-flop circuit, or may be applied to a latch circuit.

It is to be noted that effects described in the present specification are merely examples and are not limited, and may include another effect.

It is to be noted that the technology can have the following configurations.

(1)

A semiconductor circuit including:

a first circuit that is able to generate, on the basis of a voltage in a first node, an inverted voltage of the voltage and to apply the inverted voltage to a second node;

a second circuit that is able to generate, on the basis of a voltage in the second node, an inverted voltage of the voltage and to apply the inverted voltage to the first node;

a first transistor that couples the first node to a third node when being in on state;

a second transistor that supplies a first direct-current voltage to the third node when being in on state;

a third transistor that includes a drain or a source to be coupled to the third node and includes a gate coupled to the first node or the second node; and a first storage element that has a first terminal coupled to the third node and is able to take a first resistance state or a second resistance state, the first circuit and the second circuit being configured to cause the voltage in the first node to easily become a predetermined initial voltage after application of power.

(2)

The semiconductor circuit according to (1) further including a fourth transistor, in which one of the drain and the source of the third transistor is coupled to the third node, and the fourth transistor supplies a second direct-current voltage to the other one of the drain and the source of the third transistor when being in on state.

(3)

The semiconductor circuit according to (2), further including:

a third circuit that is able to generate, on the basis of a voltage in a fourth node, an inverted voltage of the voltage and to apply the inverted voltage to a fifth node;

a fourth circuit that is able to generate, on the basis of a voltage in the fifth node, an inverted voltage of the voltage and to apply the inverted voltage to the fourth node;

a fifth transistor that couples the fourth node to a sixth node when being in on state;

a sixth transistor that supplies the first direct-current voltage to the sixth node when being in on state;

a seventh transistor that includes a drain or a source to be coupled to the sixth node and includes a gate coupled to the fourth node or the fifth node; and a second storage element that is coupled to the sixth node and is able to take the first resistance state or the second resistance state, in which one of the drain and the source of the seventh transistor is coupled to the sixth node, and the fourth transistor further supplies the second direct-current voltage to the other one of the drain and the source of the seventh transistor when being in on state.

(4)

The semiconductor circuit according to (1), further including a fourth transistor, in which one of the drain and the source of the third transistor is coupled to the third node through the fourth transistor, and the other one is supplied with a second direct-current voltage, and the fourth transistor couples one of the drain and the source of the third transistor to the third node when being in on state.

(5)

The semiconductor circuit according to any of (2) to (4), further including a drive unit, in which the first storage element further includes a second terminal supplied with a control voltage, wherein, in a first period, the drive unit sets the control voltage to a first voltage level that is different from a voltage level of the first direct-current voltage, and puts the second transistor into on state and puts the first transistor and the fourth transistor into off state, thereby putting a resistance state of the first storage element into the first resistance state, and wherein, in a second period that is after the first period, the drive unit sets the control voltage to a second voltage level, and puts the fourth transistor into on state and puts the first transistor and the second transistor into off state, thereby putting the resistance state of the first storage element into a resistance state in accordance with the voltage in the first node.

(6)

The semiconductor circuit according to (5), in which in a third period that is after the application of power, the drive unit sets the control voltage to the second voltage level, and puts the first transistor into on state and puts the second transistor and the fourth transistor into off state, thereby setting the voltage in the first node set to the initial voltage to a voltage in accordance with the resistance state of the first storage element.

(7)
The semiconductor circuit according to any of (1) to (6), in which
the first circuit includes an eighth transistor that couples a first power supply corresponding to the initial voltage to the second node when being in on state, and
the second circuit includes a ninth transistor that couples the first power supply to the first node when being in on state, and has a gate width larger than a gate width of the eighth transistor.

(8)
The semiconductor circuit according to any of (1) to (7), in which
the second circuit includes a tenth transistor that couples a second power supply corresponding to a voltage different from the initial voltage to the first node when being in on state, and
the first circuit includes an eleventh transistor that couples the second power supply to the second node when being in on state, and has a gate width larger than a gate width of the tenth transistor.

(9)
The semiconductor circuit according to any of (1) to (8), in which
the first circuit includes an eighth transistor that couples a first power supply corresponding to the initial voltage to the second node when being in on state, and
the second circuit includes a ninth transistor that couples the first power supply to the first node when being in on state, and has a gate length shorter than a gate length of the eighth transistor.

(10)
The semiconductor circuit according to any of (1) to (9), in which
the second circuit includes a tenth transistor that couples a second power supply corresponding to a voltage different from e initial voltage to the first node when being in on state, and
the first circuit includes an eleventh transistor that couples the second power supply to the second node when being in on state, and has a gate length shorter than a gate length of the tenth transistor.

(11)
The semiconductor circuit according to any of (1) to (10), in which
the second circuit includes a ninth transistor that couples a first power supply corresponding to the initial voltage to the first node when being in on state, and
when the ninth transistor is in on state, a current value of a current flowing from the first power supply to the first node is between a first current value of a current flowing from the first node to the first storage element through the first transistor when the first transistor is in on state and a resistance state of the first storage element is in the first resistance state and a second current value of a current flowing from the first node to the first storage element through the first transistor when the first transistor is in on state and a resistance state of the first storage element is in the second resistance state.

(12)
The semiconductor circuit according to any of (1) to (11), further including a power transistor that supplies a power voltage or a ground voltage to the first circuit and the second circuit when being in on state.

(13)
The semiconductor circuit according to any of (1) to (12), in which the first resistance state is lower in resistance value than the second resistance state.

(14)
The semiconductor circuit according to any of (1) to (12), in which the first resistance state is higher in resistance value than the second resistance state.

(15)
The semiconductor circuit according to any of (1) to (14), in which the first storage element further includes a second terminal, and stores therein information by using reversible changes of a resistance state in accordance with a direction of a current flowing between the first terminal and the second terminal.

(16)
The semiconductor circuit according to (15), in which the first storage element is a spin transfer torque storage element.

(17)
The semiconductor circuit according to any of (1) to (16), including an SRAM circuit,
in which the SRAM circuit includes the first circuit and the second circuit.

(18)
The semiconductor circuit according to any of (1) to (16), including a latch circuit, in which the latch circuit includes the first circuit and the second circuit.

(19)
The semiconductor circuit according to any of (1) to (16), including a flip-flop circuit including a master latch circuit and a slave latch circuit,
in which the slave latch circuit has the first circuit and the second circuit.

(20)
A driving method, including:
preparing a semiconductor circuit, the semiconductor circuit including a first circuit that is able to generate, on a basis of a voltage in a first node, an inverted voltage of the voltage and to apply the inverted voltage to a second node, a second circuit that is able to generate, on a basis of a voltage in the second node, an inverted voltage of the voltage and to apply the inverted voltage to the first node, a first transistor that couples the first node to a third node when being in on state, a second transistor that supplies a first direct-current voltage to the third node when being in on state, a third transistor that includes a drain or a source to be coupled to the third node and includes a gate coupled to the first node or the second node, and a first storage element that includes a first terminal coupled to the third node and a second terminal supplied with a control voltage, and is able to take a first resistance state or a second resistance state, the first circuit and the second circuit being configured to cause the voltage in the first node to easily become a predetermined initial voltage after application of power;
performing first driving of, in a first period, setting the control voltage to a first voltage level that is different from a voltage level of the first direct-current voltage, and putting the second transistor into on state and putting the first transistor into off state, thereby putting a resistance state of the first storage element into the first resistance state; and
performing second driving of, in a second period that is after the first period, setting the control voltage to a second voltage level, and putting the first transistor and the second transistor into off state, thereby putting the resistance state of the first storage element into a resistance state in accordance with the voltage in the first node.

(21)
The driving method according to (20), in which
one of the drain and the source of the third transistor is coupled to the third node,
the semiconductor circuit further includes a fourth transistor that supplies a second direct-current voltage to the other one of the drain and the source of the third transistor when being in on state,
the performing the first driving includes further putting the fourth transistor into off state in the first period, thereby performing the first driving, and
the performing the second driving includes further putting the fourth transistor into on state in the second period, thereby performing the second driving.
(22)
The driving method according to (20), in which
the semiconductor circuit further includes a fourth transistor that couples one of the drain and the source of the third transistor to the third node when being in on state,
the semiconductor circuit supplies a second direct-current voltage to the other one of the drain and the source of the third transistor,
the performing the first driving includes further putting the fourth transistor into off state in the first period, thereby performing the first driving, and
the performing the second driving includes further putting the fourth transistor into on state in the second period, thereby performing the second driving.
(23)
The driving method according to (21) or (22), further including performing third driving, in a third period that is after the second period, by setting the control voltage to the first voltage level, and putting the first transistor into on state and putting the second transistor and the fourth transistor into off state.
(24)
An electronic apparatus provided with a semiconductor circuit and a battery that supplies a power voltage to the semiconductor circuit, the semiconductor circuit including:
a first circuit that is able to generate, on the basis of a voltage in a first node, an inverted voltage of the voltage and to apply the inverted voltage to a second node;
a second circuit that is able to generate, on the basis of a voltage in the second node, an inverted voltage of the voltage and to apply the inverted voltage to the first node;
a first transistor that couples the first node to a third node when being in on state;
a second transistor that supplies a first direct-current voltage to the third node when being in on state;
a third transistor that includes a drain or a source to be coupled to the third node and includes a gate coupled to the first node or the second node; and
a first storage element that includes a first terminal coupled to the third node and is able to take a first resistance state or a second resistance state,
the first circuit and the second circuit being configured to cause the voltage in the first node to easily become a predetermined initial voltage after application of power.

This application claims for right of priority based on Japanese Patent Application No. 2016-037657 filed with the Japan Patent Office on Feb. 29, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A semiconductor circuit, comprising:
a first circuit that is able to generate, on a basis of a voltage in a first node, an inverted voltage of the voltage and to apply the inverted voltage to a second node;
a second circuit that is able to generate, on a basis of a voltage in the second node, an inverted voltage of the voltage and to apply the inverted voltage to the first node;
a first transistor that couples the first node to a third node when in an on state;
a second transistor that supplies a first direct-current voltage to the third node when in an on state;
a third transistor that includes a drain or a source to be coupled to the third node and that includes a gate coupled to the first node or the second node; and
a first storage element that includes a first terminal coupled to the third node and is able to take a first resistance state or a second resistance state,
the first circuit and the second circuit being configured to cause the voltage in the first node to easily become a predetermined initial voltage after application of power.

2. The semiconductor circuit according to claim 1, further comprising a fourth transistor,
wherein one of the drain and the source of the third transistor is coupled to the third node, and
the fourth transistor supplies a second direct-current voltage to the other one of the drain and the source of the third transistor when in an on state.

3. The semiconductor circuit according to claim 2, further comprising:
a third circuit that is able to generate, on a basis of a voltage in a fourth node, an inverted voltage of the voltage and to apply the inverted voltage to a fifth node;
a fourth circuit that is able to generate, on a basis of a voltage in the fifth node, an inverted voltage of the voltage and to apply the inverted voltage to the fourth node;
a fifth transistor that couples the fourth node to a sixth node when in an on state;
a sixth transistor that supplies the first direct-current voltage to the sixth node when in an on state;
a seventh transistor that includes a drain or a source to be coupled to the sixth node and includes a gate coupled to the fourth node or the fifth node; and
a second storage element that is coupled to the sixth node and is able to take the first resistance state or the second resistance state,
wherein one of the drain and the source of the seventh transistor is coupled to the sixth node, and
the fourth transistor further supplies the second direct-current voltage to the other one of the drain and the source of the seventh transistor when in an on state.

4. The semiconductor circuit according to claim 1, further comprising a fourth transistor,
wherein one of the drain and the source of the third transistor is coupled to the third node through the fourth transistor, and the other one is supplied with a second direct-current voltage, and
the fourth transistor couples one of the drain and the source of the third transistor to the third node when in an on state.

5. The semiconductor circuit according to claim 2, further comprising a drive unit,
wherein the first storage element further includes a second terminal supplied with a control voltage,
wherein, in a first period, the drive unit sets the control voltage to a first voltage level that is different from a voltage level of the first direct-current voltage, and puts the second transistor into the on state and puts the first transistor and the fourth transistor into an off state, thereby putting a resistance state of the first storage element into the first resistance state, and
wherein, in a second period that is after the first period, the drive unit sets the control voltage to a second voltage level, and puts the fourth transistor into the on state and puts the first transistor and the second transistor into an off state, thereby putting the resistance state of the first storage element into a resistance state in accordance with the voltage in the first node.

6. The semiconductor circuit according to claim 5, wherein in a third period that is after the application of power, the drive unit sets the control voltage to the second voltage level, and puts the first transistor into the on state and puts the second transistor and the fourth transistor into the off state, thereby setting the voltage in the first node set to the initial voltage to a voltage in accordance with the resistance state of the first storage element.

7. The semiconductor circuit according to claim 1, wherein
the first circuit includes an eighth transistor that couples a first power supply corresponding to the initial voltage to the second node when in an on state, and
the second circuit includes a ninth transistor that couples the first power supply to the first node when in an on state, and has a gate width larger than a gate width of the eighth transistor.

8. The semiconductor circuit according to claim 1, wherein
the second circuit includes a tenth transistor that couples a second power supply corresponding to a voltage different from the initial voltage to the first node when in an on state, and
the first circuit includes an eleventh transistor that couples the second power supply to the second node when in an on state, and has a gate width larger than a gate width of the tenth transistor.

9. The semiconductor circuit according to claim 1, wherein
the first circuit includes an eighth transistor that couples a first power supply corresponding to the initial voltage to the second node when in an on state, and
the second circuit includes a ninth transistor that couples the first power supply to the first node when in an on state, and has a gate length shorter than a gate length of the eighth transistor.

10. The semiconductor circuit according to claim 1, wherein
the second circuit includes a tenth transistor that couples a second power supply corresponding to a voltage different from the initial voltage to the first node when in an on state, and
the first circuit includes an eleventh transistor that couples the second power supply to the second node when in an on state, and has a gate length shorter than a gate length of the tenth transistor.

11. The semiconductor circuit according to claim 1, wherein
the second circuit includes a ninth transistor that couples a first power supply corresponding to the initial voltage to the first node when in an on state, and
when the ninth transistor is in the on state, a current value of a current flowing from the first power supply to the first node is between a first current value of a current flowing from the first node to the first storage element through the first transistor when the first transistor is in the on state and a resistance state of the first storage element is in the first resistance state and a second current value of a current flowing from the first node to the first storage element through the first transistor when the first transistor is in the on state and a resistance state of the first storage element is in the second resistance state.

12. The semiconductor circuit according to claim 1, further comprising a power transistor that supplies a power voltage or a ground voltage to the first circuit and the second circuit when in an on state.

13. The semiconductor circuit according to claim 1, wherein the first resistance state is lower in resistance value than the second resistance state.

14. The semiconductor circuit according to claim 1, wherein the first resistance state is higher in resistance value than the second resistance state.

15. The semiconductor circuit according to claim 1, wherein the first storage element further includes a second terminal, and stores therein information by using reversible changes of a resistance state in accordance with a direction of a current flowing between the first terminal and the second terminal.

16. The semiconductor circuit according to claim 15, wherein the first storage element is a spin transfer torque storage element.

17. The semiconductor circuit according to claim 1, comprising an SRAM circuit, wherein the SRAM circuit includes the first circuit and the second circuit.

18. The semiconductor circuit according to claim 1, comprising a latch circuit, wherein the latch circuit includes the first circuit and the second circuit.

19. The semiconductor circuit according to claim 1, comprising a flip-flop circuit including a master latch circuit and a slave latch circuit, wherein the slave latch circuit includes the first circuit and the second circuit.

20. A driving method, comprising:
preparing a semiconductor circuit, the semiconductor circuit including a first circuit that is able to generate, on a basis of a voltage in a first node, an inverted voltage of the voltage and to apply the inverted voltage to a second node, a second circuit that is able to generate, on a basis of a voltage in the second node, an inverted voltage of the voltage and to apply the inverted voltage to the first node, a first transistor that couples the first node to a third node when in an on state, a second transistor that supplies a first direct-current voltage to the third node when in an on state, a third transistor that includes a drain or a source to be coupled to the third node and includes a gate coupled to the first node or the second node, and a first storage element that includes a first terminal coupled to the third node and a second terminal supplied with a control voltage, and is able to take a first resistance state or a second resistance state, the first circuit and the second circuit being configured to cause the voltage in the first node to easily become a predetermined initial voltage after application of power;

performing first driving of, in a first period, setting the control voltage to a first voltage level that is different from a voltage level of the first direct-current voltage, and putting the second transistor into the on state and putting the first transistor into an off state, thereby putting a resistance state of the first storage element into the first resistance state; and performing second driving of, in a second period that is after the first period, setting the control voltage to a second voltage level, and putting the first transistor and the second transistor into an off state, thereby putting the resistance state of the first storage element into a resistance state in accordance with the voltage in the first node.

21. The driving method according to claim 20, wherein one of the drain and the source of the third transistor is coupled to the third node, the semiconductor circuit further includes a fourth transistor that supplies a second direct-current voltage to the other one of the drain and the source of the third transistor when in an on state, the performing the first driving includes further putting the fourth transistor into an off state in the first period, thereby performing the first driving, and the performing the second driving includes further putting the fourth transistor into the on state in the second period, thereby performing the second driving.

22. The driving method according to claim 20, wherein the semiconductor circuit further includes a fourth transistor that couples one of the drain and the source of the third transistor to the third node when being in on state, the semiconductor circuit supplies a second direct-current voltage to the other one of the drain and the source of the third transistor, the performing the first driving includes further putting the fourth transistor into an off state in the first period, thereby performing the first driving, and the performing the second driving includes further putting the fourth transistor into an on state in the second period, thereby performing the second driving.

23. The driving method according to claim 21, further comprising performing third driving, in a third period that is after the second period, by setting the control voltage to the first voltage level, and putting the first transistor into the on state and putting the second transistor and the fourth transistor into an off state.

24. An electronic apparatus provided with a semiconductor circuit and a battery that supplies a power voltage to the semiconductor circuit, the semiconductor circuit comprising:

a first circuit that is able to generate, on a basis of a voltage in a first node, an inverted voltage of the voltage and to apply the inverted voltage to a second node;

a second circuit that is able to generate, on a basis of a voltage in the second node, an inverted voltage of the voltage and to apply the inverted voltage to the first node;

a first transistor that couples the first node to a third node when in an on state;

a second transistor that supplies a first direct-current voltage to the third node when in an on state;

a third transistor that includes a drain or a source to be coupled to the third node and includes a gate coupled to the first node or the second node; and a first storage element that includes a first terminal coupled to the third node and is able to take a first resistance state or a second resistance state, the first circuit and the second circuit being configured to cause the voltage in the first node to easily become a predetermined initial voltage after application of power.

* * * * *